United States Patent [19]

Powell

[11] Patent Number: 5,526,278

[45] Date of Patent: Jun. 11, 1996

[54] METHOD AND APPARATUS FOR CONVERTING FIELD-PROGRAMMABLE GATE ARRAY IMPLEMENTATIONS INTO MASK-PROGRAMMABLE LOGIC CELL IMPLEMENTATIONS

[75] Inventor: Gary P. Powell, Allentown, Pa.

[73] Assignee: AT&T Corp., Murray Hill, N.J.

[21] Appl. No.: 492,604

[22] Filed: Jun. 20, 1995

Related U.S. Application Data

[63] Continuation of Ser. No. 175,658, Dec. 30, 1993, abandoned.

[51] Int. Cl.⁶ .................................................... G06F 17/50
[52] U.S. Cl. ............................................ 364/489; 364/488
[58] Field of Search ..................................... 364/488, 489, 364/490; 326/37, 38; 340/828.83

[56] References Cited

U.S. PATENT DOCUMENTS

| | | | |
|---|---|---|---|
| 4,978,633 | 12/1990 | Seefeldt et al. | 364/497 |
| 5,109,353 | 4/1992 | Sample et al. | 364/578 |
| 5,189,629 | 2/1993 | Kohnen | 364/490 |
| 5,224,056 | 6/1993 | Chene et al. | 364/490 |
| 5,329,470 | 7/1994 | Sample et al. | 364/578 |
| 5,337,255 | 8/1994 | Seidel et al. | 364/489 |
| 5,349,248 | 9/1994 | Parlour et al. | 364/489 |

OTHER PUBLICATIONS

"FPGA Conversion", by Charles H. Small, Senior Technical Editor, *EDN,* Jun. 4, 1992, pp. 107–116.

"FPGA Migration", AT&T Microelectronics, Jun. 1992.

"Converting to Gate Arrays", by Larry Waller, ASIC & EDA Tehnologies for System Design, May 1992, pp. 14–18.

"Synthesis speeds FPGA retargeting, design", by Steven Wolfe, Electronic Engineering Times, Apr. 27, 1992, pp. 46 & 74.

"AT&T aims to bite Xilinx with Orca FPGA", by Richard Goering, Electronic Engineering Times, Apr. 27, 1992, p. 4.

"Data Sheet for the ATT3000 Series Field–Programmable Gate Arrays", AT&T Microelectronics, Aug. 1991.

"Chortle: A Technology Mapping Program for Look–Up Table–Based Field Programmable Gate Arrays" by Francis et al, 27th ACM/IEEE Design Automation Conf., 1990, pp. 613–619.

"Socrates: A System for Automatically Synthesizing and Optimizing Combinational Logic" by Gregory et al., IEEE 23rd Design Automation Conf., 1986, pp. 79–85.

"Automatic Synthesis and Technology Mapping of Combinational Logic" by R. A. Bergamaschi, IEEE 1988, pp. 466–469.

*Primary Examiner*—Vincent N. Trans

[57] ABSTRACT

A method and system, in which the relative physical placement of configurable logic blocks, signal routing networks, and clock distribution trees of the FPGA implementation is preserved on the mask programmable logic cell (MPLC) substrate after the conversion process is completed. By constraining the physical placement of corresponding structures on the MPLC substrate at the network level of the MPLC implementation, the relative signal and clock delays presented during the FPGA implementation are substantially maintained in the MPLC implementation, thereby assuring functional equivalence between the FPGA and MPLC implementations.

20 Claims, 21 Drawing Sheets

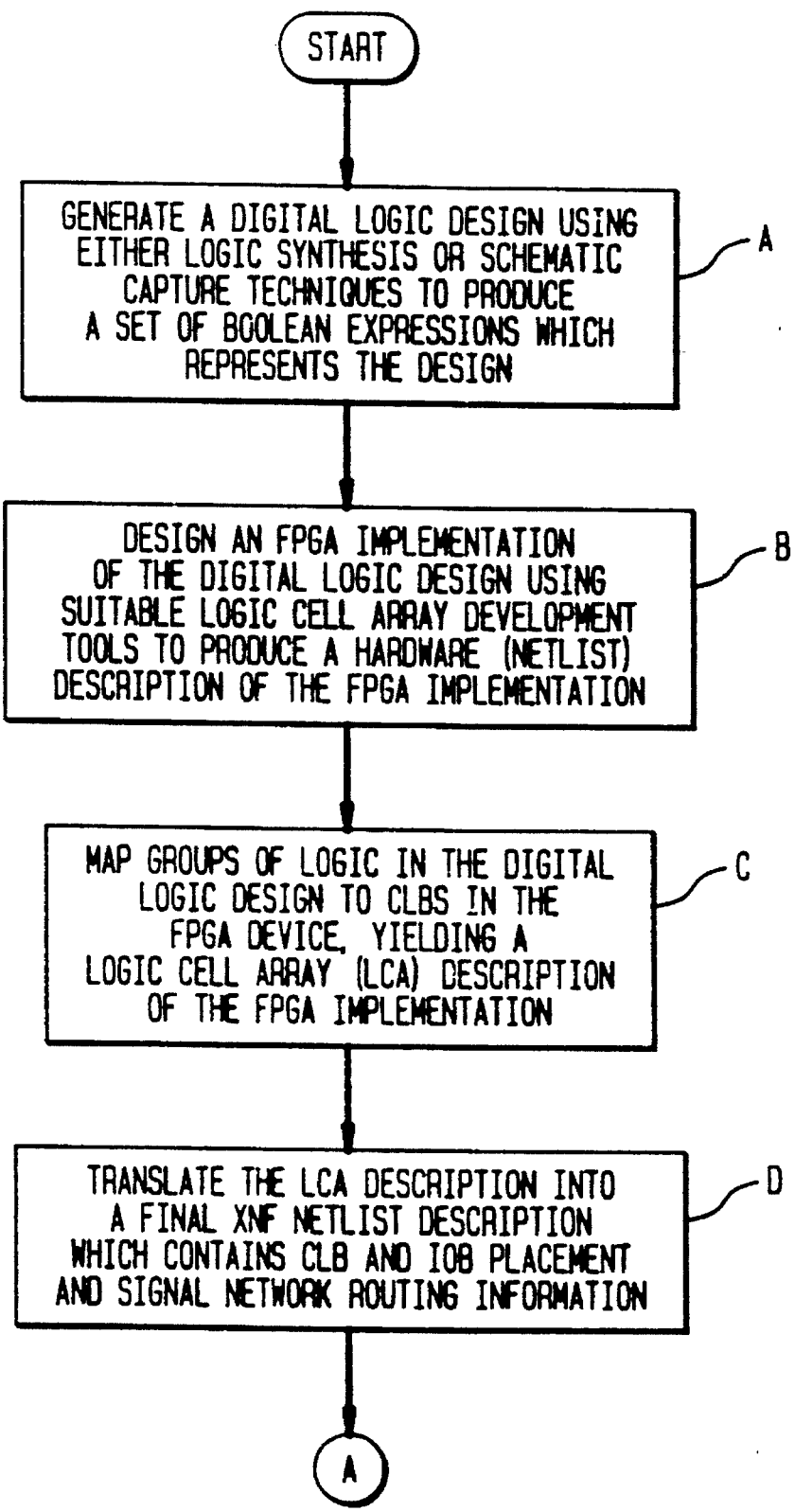

FIG. 2
(PRIOR ART)

```
SYM, X00290X._CLB, LOC=AA, BLKNM=X00290X
CFG, BASE F
CFG, CONFIG F: Q Y: Q X: Q: FF RES: SET: CLK: C
CFG, EQUATE F=-(Q)
PIN, C, I, X00291X, 17
PIN, Y, O, X00290X
MODEL
SYM, X00290X.Y, BUF
PIN, I, I, X00290X.Q, 0
PIN, O, O, X00290X, 4
END
SYM, X00290X.F, INV
PIN, I, I, X00290X.Q, 0
PIN, O, O, X00290X.F, 6
END
SYM, X00290X.Q, DFF
PIN, Q, O, X00290X.Q, 4
PIN, D, I, X00290X.F, 0
PIN, C, I, X00291X, 22
SETUP, D, C, +, 6, 1
PULSE, C, +, 7
PIN, GR, I, GLOBALRESET-, 12
PULSE, GR, -, 150
END
ENDMOD
END
```

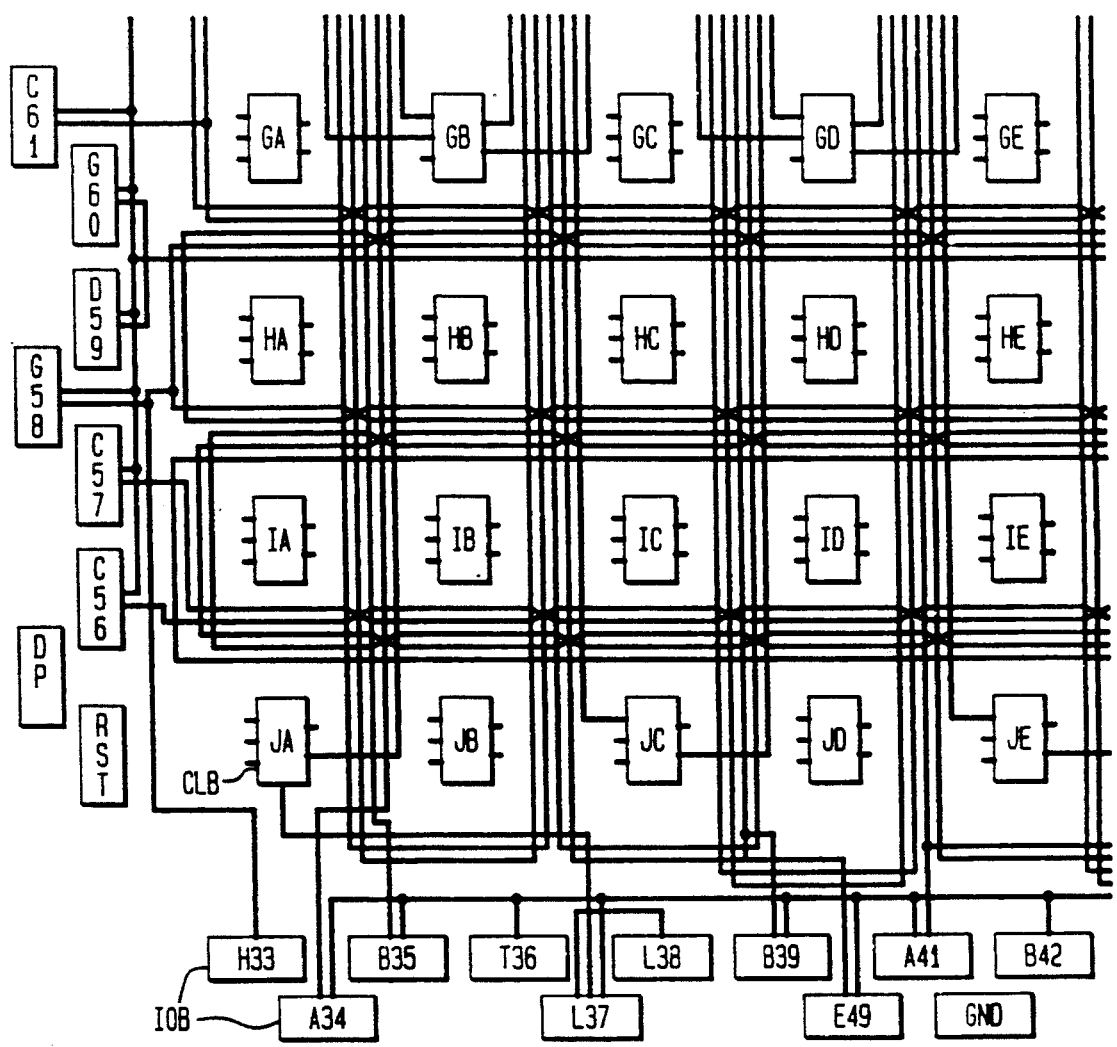
FIG. 6C
FIG. 6
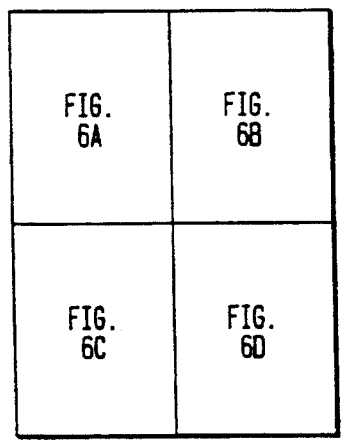

FIG. 7

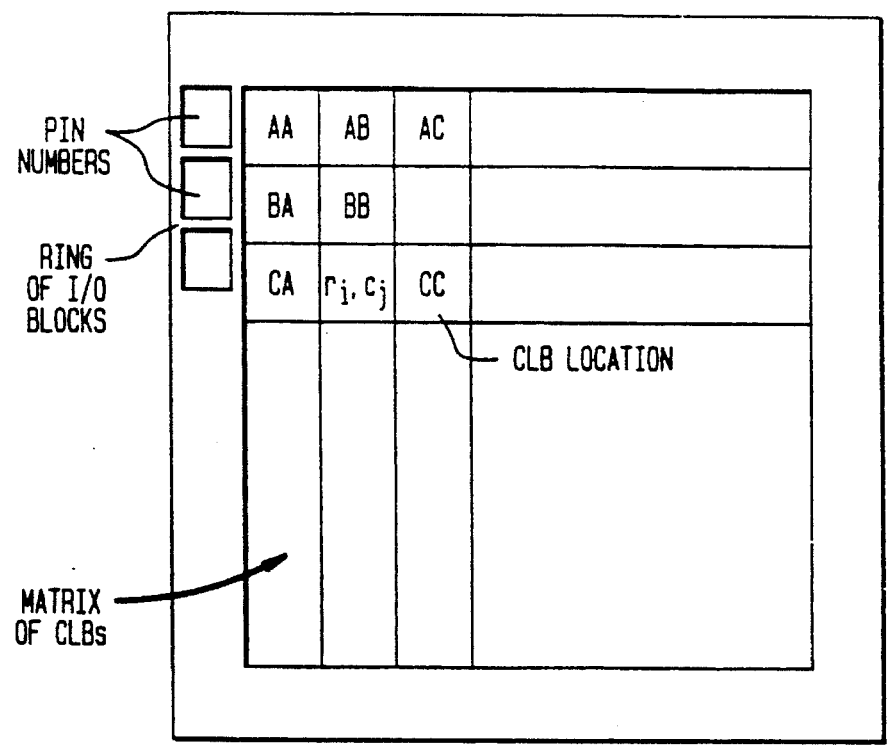

- PIN NUMBERS
- RING OF I/O BLOCKS
- CLB LOCATION
- MATRIX OF CLBs

FIG. 8E

| MIGRATION LIBRARIES | | | |
|---|---|---|---|
| CELL TYPE | FPGA LIBRARY | GATE ARRAY LIBRARY | STANDARD CELL LIBRARY |
| COMBINATIONAL CELLS | BUFF | L111 | - |
| | INV | L101 | INRB |
| | AND | L312 | AND2 |
| | NAND | L302 | NO2 |
| | OR | L212 | OR2 |
| | NOR | L202 | NR2 |
| | XOR | L501 | XOR |
| | XNOR | L512 | XNOR |
| I/O | IBUF | FI01 | BIN10T |
| | OBUF | F001 | BON6T |
| | OBUFZ | B008 | BOT6T |
| | INFF | FI01 + L617 | BIN10T + FD1S30X |
| | OUTFF | F001 + L617 | BON6T + FD1S30X |
| | OUTFFZ | B008 + L617 | BOT6T + FD1S30X |
| FLIP-FLOP | DFF | L617 | FD1S30X |
| CLOCK | ACLK | F102 | INRBH |
| | BCLK | F102 | INRBH |

FPGA NETLIST

FIG. 8A

```
LCANET, 4
PROG, LCA2XNF, VER. 4.03: FILE=PERI.LCA
PART, 2018PC68-70
PWR, 0, GND
PWR, 1, VCC1
EXT, 12MCK_1, I, 11
EXT, LDC_1, O, 30
EXT, BCRD2_1, I, 33
EXT, BCRD1_1, I, 34
EXT, READY_1, O, 22
EXT, WRN_1, I, 20
EXT, STEN_1, I, 42
EXT, SEREN_1, I, 17
EXT, RELAY_1, T, 31
EXT, RDN_1, I, 29
EXT, RDEN_1, I, 43
EXT, BCLANE_1, I, 24
EXT, BCLAND_1, I, 23
EXT, A7_1, O, 53
EXT, A6_1, O, 41
EXT, A5_1, O, 50
EXT, A4_1, O, 51
EXT, A3_1, O, 59
EXT, A2_1, O, 61
EXT, A1_1, O, 57
EXT, A0_1, O, 64
EXT, ALE_1, I, 3
EXT, GPIN3_1, I, 36
EXT, GPIN2_1, I, 38
EXT, GPIN1_1, I, 39
EXT, AD6_1, B, 46
EXT, AD5_1, B, 47
EXT, AD7_1, B, 48
EXT, AD4_1, B, 49
EXT, AD3_1, B, 54
EXT, AD2_1, B, 55
EXT, AD1_1, B, 56
EXT, AD0_1, B, 67
EXT, BCCK2_1, O, 68
EXT, BCCK1_1, O, 2
EXT, BCCD2_1, O, 65
EXT, BCCD1_1, O, 66
EXT, GLOBALRESET-, I, 44
```

FIG. 8B

```
      ┌ EXT, BCLANE_1, I, 24
      │ SYM, IRELAY_1, CLB, LOC=JB, BLKNM=IRELAY_1
      │ CFG, BASE FG
      │ CFG, CONFIG F:D:B G:D:A:B Y:F X:G Q: RES: SET: CLK:
      │ CFG, EQUATE F=~(B*D)
      │ CFG, EQUATE G=~(A*~(B*D))
      │ PIN, D, I, X00016X, 2
      │ PIN, X, O, X00016X
      │ PIN, Y, O, IRELAY_1
      │ PIN, A, I, IBCLANE_1, 2
      │ PIN, B, I, IBCLAND_1, 2
      │ MODEL
      │ SYM, IRELAY_1.Y, BUF
      │ PIN, I, I, IRELAY_1.F, 0
      │ PIN, O, O, IRELAY_1, 4
      │ END
      │ SYM, IRELAY_1.X, BUF
CLB ──┤ PIN, I, I, IRELAY_1.G, 0
      │ PIN, O, O, X00016X, 4
      │ END
      │ SYM, IRELAY_1.F, NAND
      │ PIN, O, O, IRELAY_1.F, 6
      │ PIN, 1, I, IBCLAND_1, 2
      │ PIN, 2, I, X00016X, 2
      │ END
      │ SYM, IRELAY_1.G1, NAND
      │ PIN, O, O, IRELAY_1.G1, 0
      │ PIN, 1, I, IBCLAND_1, 2
      │ PIN, 2, I, X00016X, 2
      │ END
      │ SYM, IRELAY_1.G, NAND
      │ PIN, O, O, IRELAY_1.G, 6
      │ PIN, 1, I, IBCLANE_1, 2
      │ PIN, 2, I, IRELAY_1.G1, 0
      │ END
      │ ENDMOD
      └ END
```

FIG. 8D

```
SYM, CLK.KK, ACLK
PIN, I, I, X00160X, 12
PIN, O, O, L_S_1, 4
END
SYM, CLK.AA, GCLK
PIN, I, I, X00261X, 3
PIN, O, O, CLOCKI_1, 4
END
```

FIG. 8C

```
      ┌ SYM, BCLANE_1, IOB, LOC=P24, BLKNM=BCLANE_1
      │ CFG, BASE IO
      │ CFG, CONFIG I:PAD BUF:
      │ PIN, I, O, IBCLANE_1
      │ MODEL
IOB ──┤ SYM, BCLANE_1.IBUF, IBUF
      │ PIN, O, O, IBCLANE_1, 6
      │ PIN, I, I, BCLANE_1, 0
      │ END
      │ ENDMOD
      └ END
```

FIG. 11A

```
NETWORK:
CKTNAME: NEWPERI ;
INPUTS: MCK12, BCRD2, BCRD1, WRN, STEN, SEREN, RDN, RDEN, BCLANE, BCLAND, ALE,
        GPIN3, GPIN2, GPIN1, AD6I, AD5I, AD7I, AD4I, AD3I, AD2I, AD1I, AD0I,
        IGRST, DONEI ;
OUTPUTS: LDC, READY, RELAY, A7, A6, A5, A4, A3, A2, A1, A0, AD60, AD50, AD70, AD40,
         AD30, AD20, AD10, AD00, BCCK2, BCCK1, BCCD2, BCCD1, DONEO ;
```

FIG. 11D

```
INPUTS: MCK12, BCRD2, BCRD1, WRN, STEN, SEREN, RDN, RDEN, BCLANE, BCLAND, ALE,
        GPIN3, GPIN2, GPIN1, AD6I, AD5I, AD7I, AD4I, AD3I, AD2I, AD1I, AD0I,
        IGRST, DONEI ;
OUTPUTS: LDC, READY, RELAY, A7, A6, A5, A4, A3, A2, A1, A0, AD60, AD50, AD70, AD40,
         AD30, AD20, AD10, AD00, BCCK2, BCCK1, BCCD2, BCCD1, DONEO ;
FI01;  MCK12_1.IBUF_IBUF_, (MCK12), (X00262X) ;
FO04:  LDC.OBUF_OBUF_, (VCC), (LDC) ;
FI01;  BCRD2.IBUF_IBUF_, (BCRD2), (RD2I_1) ;
FI01;  BCRD1.IBUF_IBUF_, (BCRD1), (RD1I_1) ;
FO04:  READY.OBUF_OBUF_, (RDYPLS_1), (READY) ;
FI01;  WRN.IBUF_IBUF_, (WRN), (IWRN_1) ;
FI01;  STEN.IBUF_IBUF_, (STEN), (ISTEN_1) ;
FI01;  SEREN.IBUF_IBUF_, (SEREN), (ISER_1) ;
BOOE:  RELAY.OBUFZ_OBUFZ_, (IRELAY_1, RELAY.OBUFZ_IT), (RELAY) ;
FI01;  RDN.IBUF_IBUF_, (RDN), (IRDN_1) ;
FI01;  RDEN.IBUF_IBUF_, (RDEN), (IRDEN_1) ;
FI01;  BCLANE.IBUF_IBUF_, (BCLANE), (IBCLANE1) ;
CLBJB: JB, (IBCLANE1, IBCLAND1, CLOCKI, B, L, S, B), (X00016X, IRELAY_1) ;
FI01;  BCLAND.IBUF_IBUF_, (BCLAND), (IBCLAND1) ;
FO04:  A7.OBUF_OBUF_, (IA7_1), (A7) ;
FO04:  A6.OBUF_OBUF_, (IA6_1), (A6) ;
FO04:  A5.OBUF_OBUF_, (IA5_1), (A5) ;
FO04:  A4.OBUF_OBUF_, (IA4_1), (A4) ;
FO04:  A3.OBUF_OBUF_, (IA3_1), (A3) ;
FO04:  A2.OBUF_OBUF_, (IA2_1), (A2) ;
FO04:  A1.OBUF_OBUF_, (IA1_1), (A1) ;
FO04:  A0.OBUF_OBUF_, (IA0_1), (A0) ;
FI01:  ALE.IBUF_IBUF_, (ALE), (IALE_1) ;
FI01:  GPIN3.IBUF_IBUF_, (GPIN3), (GPI3_1) ;
```

FIG. 11B

```
OPTIONS: MULTISOURCE=YES ;
SUBNETWK:
CKTNAME: CLBAA ;
INPUTS: X00291X, GRST, ICLK ;
OUTPUTS: X00290X ;
L101: CLKLD, (ICLK), () ;
L111: X00290X.Y_BUF_, (X00290X.Q), (X00290X) ;
L617: X00290X.Q_DFF_, (X00290X.F, X00291X, X00290X.Q_RST, X00290X.Q_0_NET),
       (X00290X.Q) ;
L101: SYG_X00290X.Q_RST, (SYG_S202), (X00290X.Q_RST) ;
L101: SYG_S202, (GRST), (SYG_S202) ;
L101: SYG_X00290X.F, (X00290X.Q), (X00290X.F) ;
F091: HLCELL_0, (X00290X.Q_0_NET) ;
```

FIG. 11C

```
* bd21s1 3.5 ;
OPTIONS: MULTISOURCE=YES ;
SUBNETWK:
CKTNAME: CLBJB ;
INPUTS: IBCLANE1, IBCLAND1, GCLK, ACLK ;
OUTPUTS: X00016X, IRELAY_1 ;
L101: ACLKLD, (ACLK), () ;
L101: GCLKLD, (GCLK), () ;
L111: IRELAY_1.Y_BUF_, (IRELAY_1.F), (IRELAY_1) ;
L111: IRELAY_1.X_BUF_, (IRELAY_1.G), (X00016X) ;
L302: SYG_IRELAY_1.G, (SYG_S212, IBCLANE1), (IRELAY_1.G) ;
L302: SYG_S212, (IBCLAND1, X00016X), (SYG_S212) ;
L302: SYG_IRELAY_1.F, (IBCLAND1, X00016X), (IRELAY_1.F) ;

CLBAA: AA, (X00231X, GRSTA, ICLKA), (X00290X) ;
CLBBA: BA, (X00228X, SANRST_2, GRSTA, ICLKA), (X00229X) ;
CLBAB: AB, (X00225X, SANRST_2, GRSTB, ICLKB), (X00226X) ;
CLBAG: AG, (X00223X, SANRST_2, GRSTG, ICLKG), (X00224X) ;
CLBAI: AI, (X00220X, SANRST_2, GRSTI, ICLKI), (X00221X) ;
CLBAJ: AJ, (X00217X, SANRST_2, GRSTJ, ICLKJ), (X00218X) ;
CLBCA: CA, (X00229X, X00228X, SANRST_2, GRSTA, ICLKA), (Q19_2) ;
CLBBE: BE, (X00227X, SANRST_2, Q15_2, GRSTE, ICLKE), (X00228X) ;
CLBAE: AE, (SANRST_2, Q15_2, GRSTE, ICLKE), (X00227X) ;
CLBBB: BB, (X00226X, X00225X, SANRST_2, GRSTB, ICLKB), (Q15_2) ;
CLBBF: BF, (SANRST_2, Q12_2, Q11_2, GRSTF, ICLKF), (X00225X) ;
```

FIG. 11E
A CLK SIGNAL
DIST. TREE

```
F102: CLK, KK, ACLK_, (X00160X), (L_S_1) ;
F102: ACLKA, (L_S_1), (L_S_A) ;
F102: ACLKB, (L_S_1), (L_S_B) ;
F102: ACLKC, (L_S_1), (L_S_C) ;
F102: ACLKD, (L_S_1), (L_S_D) ;
F102: ACLKE, (L_S_1), (L_S_E) ;
F102: ACLKF, (L_S_1), (L_S_F) ;
F102: ACLKG, (L_S_1), (L_S_G) ;
F102: ACLKH, (L_S_1), (L_S_H) ;
F102: ACLKI, (L_S_1), (L_S_I) ;
F102: ACLKJ, (L_S_1), (L_S_J) ;
```

FIG. 11F
G CLK SIGNAL
DIST. TREE

```
F102: CLK, AA, GCLK_, (X00281X), (GCLK) ;
F102: GCLKA, (GCLK), (CLOCKI_A) ;
F102: GCLKB, (GCLK), (CLOCKI_B) ;
F102: GCLKC, (GCLK), (CLOCKI_C) ;
F102: GCLKD, (GCLK), (CLOCKI_D) ;
F102: GCLKE, (GCLK), (CLOCKI_E) ;
F102: GCLKF, (GCLK), (CLOCKI_F) ;
F102: GCLKG, (GCLK), (CLOCKI_G) ;
F102: GCLKH, (GCLK), (CLOCKI_H) ;
F102: GCLKI, (GCLK), (CLOCKI_I) ;
F102: GCLKJ, (GCLK), (CLOCKI_J) ;
```

FIG. 11G
GLOBAL RESET SIGNAL
DIST. TREE

```
F102: GPP1, (GGRST), (IGGRST) ;
F102: GGRSTA, (IGGRST), (GRSTA) ;
F102: GGRSTB, (IGGRST), (GRSTB) ;
F102: GGRSTC, (IGGRST), (GRSTC) ;
F102: GGRSTD, (IGGRST), (GRSTD) ;
F102: GGRSTE, (IGGRST), (GRSTE) ;
F102: GGRSTF, (IGGRST), (GRSTF) ;
F102: GGRSTG, (IGGRST), (GRSTG) ;
F102: GGRSTH, (IGGRST), (GRSTH) ;
F102: GGRSTI, (IGGRST), (GRSTI) ;
F102: GGRSTJ, (IGGRST), (GRSTJ) ;
```

FIG. 11H

```
CLSLOAD: JA, (CLOCKI_A, L_S_A), 0 ;   } CLBLOAD

* MOTIS-ORIENTED LSL DESCRIPTION ;
* db21s1 3.5 ;
OPTIONS: MULTISOURCE=YES ;
SUBNETWK:
CKTNAME: CLBLOAD ;                    } CLBLOAD SUBNETWORK
INPUTS: GCLK, ACLK ;
OUTPUTS: GC ;
L101: GCLKLD, (GCLK), (GC) ;
L101: ACLKLD, (ACLK), 0 ;
```

METHOD AND APPARATUS FOR CONVERTING FIELD-PROGRAMMABLE GATE ARRAY IMPLEMENTATIONS INTO MASK-PROGRAMMABLE LOGIC CELL IMPLEMENTATIONS

This is a continuation of application Ser. No. 08/175,658 filed on Dec. 30, 1993 now abandoned.

BACKGROUND OF INVENTION

1. Field Of Invention

The present invention relates generally a method and apparatus for converting field-programmable logic cell implementations into mask-programmable logic cell implementations. More particularly, the present invention relates to an improved method and apparatus for converting field-programmable gate array (FPGA) implementations into mask-programmable gate array (MPGA) implementations or into mask-programmable standard cell (MPSC) implementations.

2. Brief Description Of The Prior Art

Electronic devices, such as integrated circuit (IC) chips, are presently used in diverse fields of human endeavor, including, for example, manufacturing, industry, science, defense, recreation, and education. Practically speaking, the purpose of such devices is to perform various functions upon the signals provided to the terminals (i.e., pins) thereof.

From a design standpoint, each device is characterized by the functions it performs, namely: relating (i.e., "mapping") its input signals to its output signals. In the case of digital electronic type devices, the input and output signals are constrained to discrete (i.e., binary) values or variables, and the number of mappings (i.e., functions) that can be performed between the digital input and output signals of the device is limited by the number of possible states that the device may attain and the state transitions that the device may undergo. The various mappings performed between the digital input and output variables of devices are universally described using Boolean algebra, and often these mappings are referred to as Boolean functions. The manner in which these Boolean functions are physically implemented or realized for any particular "digital electronic design" necessarily involves the use of simpler components (such as logic gates) which are capable of performing basic Boolean functions. The resulting logic circuits are typically simplified using conventional algebraic simplification methods, Karnaugh maps, truth tables and the like. Thus, by combining and interconnecting the inputs and outputs of a number of such logic gates in a particular manner, any particular digital logic design can be physically realized.

In general, the underlying technology that is to used to implement a particular digital logic design determines the types of logic gates that will be available for combination and interconnection to realize the input-output functions of the digital logic design. Thus in theory, there are an infinite number of ways in which to implement a particular digital logic design characterized by a specified set of Boolean expressions. The object in most cases, of course, is to find an implementation that realizes the functions of the design using a minimal number of logic gates.

Upon completion of a specific digital logic design, it is necessary to physically implement the digital logic design using an available technology. In recent times, field-programmable gate array (FPGA) devices have enjoyed great popularity in low-risk prototyping and low-volume production applications.

Structurally, each field-programmable gate array device comprises a number of basic components realized on a silicon substrate that is contained in a chip package, namely: the pins on the chip package; an array of configurable logic blocks (CLB) for performing basic logic operations; a set of input/output interface blocks (IOB) for interfacing the pins on the chip package with particular CLBs; and programmable interconnect switching gates for performing signal routing functions among the CLBs and the IOBs.

Typically, each CLB and IOB has combinational and sequential logic which can be selectively configured to realize a desired logic function defined between the inputs and outputs thereof. Each CLB and IOB also has associated random access memory (RAM) for storing a configuration program that serves to select particular logic functions to be implemented. Similarly, each switching gate also has associated random access memory for storing digital code that serves to effect signal routing among the input and output ports of the CLBs and IOBs. The function of the interconnect switching gates are to facilitate controlled routing of signals among the CLBs and IOBs, as determined by the digital code stored in the random access memory of these switching gates. In order to physically implement (i.e., realize) a particular digital logic design using a FPGA device, all that is required is programming a suitable digital code into the RAM of each utilized CLB, IOB, and switching gate on the silicon substrate of the FPGA device.

It will be helpful to describe in greater detail below how a digital logic design is implemented using a conventional FPGA device.

As illustrated in Block A of FIG. 1A, the first step in the FPGA implementation method involves generating a digital logic design using, for example, logic synthesis or schematic capture techniques well known in the art. This step provides a set of Boolean logic expressions which fully represent the digital logic design.

As indicated at Block B in FIG. 1A, the second step in the method involves using a computer to produce a hardware description of the FPGA implementation. This subprocess requires using a high-level hardware description language that can be interpreted by the computer running the development program. For the Xilinx 2000 and 3000 Series FPGA devices, the FPGA implementation is described using a language specified by the Xilinx Netlist File Format (XNF). Taken together, the set of descriptive statements which describe the components in the FPGA implementation, is referred to as an original "netlist". Notably, each CLB and IOB description in the original netlist does not have a Logic Model Description, which specifies the logic within each CLB (i.e., subnetwork) and IOB. The syntax of the XNF hardware description language and the Logic Cell Array (LCA) library are described in great detail in the LCA Xilinx Netlist Specification, Version 2.00-Jan. 26, 1989, (69 pages) by Xilinx, Inc. of San Jose, Calif., which is incorporated herein by reference in its entirety.

As indicated at Block C in FIG. 1A, the third step of the method involves using the original XNF netlist and the "xnfmap" program from Xilinx in order to map groups of logic in the digital logic design, to CLBs in the FPGA device. This step produces a Logic Cell Array (LCA) description for each CLB and each IOB. The "map2lca" program from Xilinx is then used to produce an LCA description which may include up to 64 CLB descriptions, 60 IOB descriptions, a signal pin-out description, and a clock driver description.

As indicated at Block D in FIG. 1A, the fourth step in the method involves using the "lca2xnf" program from Xilinx in order to translate the LCA description into a final FPGA netlist which contains CLB and IOB placement specifications, and signal routing information for the FPGA implementation. The set of XNF statements that realize a CLB description in an exemplary FPGA netlist is shown in FIG. 2.

Thereafter, as indicated at Block E in FIG. 1B, computer system 2 executes the "makebits" program from Xilinx using the final FPGA XNF netlist in order to generate "configuration programs" (i.e., digital code) for the random access memories of the CLB, IOB and signal routing components aboard the FPGA device. In essence, the functions of the CLBs, IOBs and interconnect switches are controlled by these programs. These programs are stored in external memory. Upon power up or command, these digital codes are loaded into respective RAM elements, as indicated at Block G, to complete the programming of the FPGA device and thus physically realize the digital logic design.

Notably, the FPGA has both advantages and disadvantages. For example, after testing a programmed FPGA device using test vectors, it is easy and inexpensive to modify the original digital logic design and then reprogram the device accordingly. However, typical FPGA implementations have a high piece-part cost, and while suitable for prototyping and low-volume production, are often too expensive for high volume production. Consequently, when the demand for a particular digital logic design exceeds a certain threshold, economic considerations dictate that a different, more economically feasible technology be used to implement the successful digital logic design.

The process of implementing the functionality of a FPGA implementation in another digital technology, such as a mask-programmable gate array (MPGA) device is commonly referred to as "migration" or "implementation conversion" and has received much attention in recent times. In general, the conversion process requires mapping logic elements (such as flip-flops) and input/output (I/O) pads in the FPGA device, to their equivalent structures in the MPGA device and then resynthesizing the logic elements using logic elements available in the MPGA Library. However, when it is time to carry out the conversion process, it is often the case that the original designers of the FPGA implementation are not available to assist in the conversion (i.e., migration) of the FPGA implementation to another technology, such as mask-programmable gate array (MPGA) or mask-programmable standard cell (MPSC) technology.

In response to the need for FPGA to MPGA implementation conversions, a number of semi-automated conversion processes have been developed and are presently being used in commercial practice. In FIG. 3, a prior art method is shown for converting from an FPGA implementation into a MPGA implementation. As indicated at Block A, the first step of this method involves converting the XNF description of the FPGA implementation (produced by the process of FIG. 1), into a "flat" XNF description of the FPGA implementation. The object of this step is to remove all network level constraints on the FPGA implementation, which are imposed by the CLB boxes in the FPGA netlist. In the resulting "flat" netlist description, only gate-level logic specifications are presented. With this flat description, the logic gates, which were once confined within a CLB in the FPGA implementation, are now free to be regrouped with other logic gates and subsequently relocated on the MPGA substrate. The actual regrouping and relocation of these logic gates will be determined in accordance with the implementation scheme determined by the target technology being used in the conversion.

As indicated at Block B of FIG. 3, the second step of the method involves converting the flat FPGA netlist into the desired MPGA netlist for subsequent implementation. Then as indicated at Block C, the method involves using the MPGA netlist and the MPGA Library in order to generate a MPGA geometrical database. Notably, this geometrical database contains place and route information necessary to produce a number of "processing masks" needed to form a composite metalization pattern upon the MPGA substrate. Notably, the composite metalization pattern ultimately programs the device and realizes a MPGA implementation that is functionally equivalent to the FPGA implementation and the original digital logic design. Then at Block D, the MPGA geometrical database is used to produce the processing masks. The final step, indicated at Block E, involves using the produced processing masks to physically deposit the metalization pattern at the interconnect level of the MPGA substrate and thus realize the MPGA implementation.

While the above described method of converting from an FPGA implementation to a MPGA implementation has proved useful, it has suffered from a number of serious problems which have been described in detail in following articles: "FPGA Conversion" by Charles H. Small, in Electronic Design News, Jun. 4, 1992, pages 107–116; "FPGA-to-ASIC move takes planning" by Richard Goering, in Electronic Engineering Times, Apr. 27, 1992, Pages 45 and 46; and "AT&T AIC Application Note: Softpath Migrations: Field Programmable Gate Array to Gate Array or Standard Cell", August, 1992.

The most general statement of these problems is provided in the article "FPGA Conversion", supra. The first problem relates to the fact that each combinational logic block in the FPGA device has associated with it an inherent time delay, which is substantially constant and independent of the particular function being emulated thereby. The second problem relates to the fact that the programmable interconnect points and switching gates, required to perform signal routing operations in the FPGA device, introduce substantial signal delays which oftentimes can change or alter the logic functions being implemented within the device.

When implementing desired logic functions in a FPGA device, the above problems are easily handled by modeling these signal delays in the FPGA implementation (i.e., by the introduction of time delay blocks in the FPGA netlist). Notably, these time delays are explicitly represented in the statements used to realize various components described in the netlist.

However, when performing FPGA to MPGA implementation conversions using prior art methodologies, there typically is an unpredictable spatial mapping of CLB logic from the FPGA substrate onto the MPGA substrate, as illustrated in schematic representation of FIG. 4. Consequently, it has not been possible to solve the time delay problems described above and, in fact, other timing problems are oftentimes created during the technology conversion process.

Thus, there is a great need in the art to provide a method and apparatus for converting a FPGA implementation into a mask-programmable logic cell implementation, such as a MPGA implementation or MPSC implementation, while overcoming the problems associated with prior art systems and processes.

OBJECTS AND SUMMARY OF THE PRESENT INVENTION

Accordingly, it is a primary object of the present invention to provide a method and system for converting FPGA implementations into a mask-programmable logic cell implementations, such as MPGA or MPSC implementations, while avoiding the problems associated with prior art systems and processes.

A further object of the present invention is to provide such a conversion method and system, in which the relative physical placement of configurable logic blocks, network-level signal pathways, and clock distribution trees of the FPGA implementation is preserved on the mask programmable logic cell (MPLC) substrate after the conversion process is completed. By constraining the physical placement of corresponding structures on the MPLC substrate at the network level of the MPLC implementation, the relative signal and clock delays presented during the FPGA implementation are maintained in the MPLC implementation, thereby assuring functional equivalence between the FPGA and MPLC implementations.

A further object of the present invention is to provide such a system in the form of a computer-based workstation suitably programmed to provide logic resynthesis, and placement and routing tools necessary to perform the method of the present invention.

An even further object of the present invention is to provide very large scale integrated (VLSI) circuit on a semiconductor chip which has been manufactured in accordance with the method of the present invention.

These and further objects of the present invention will become apparent hereinafter and in the Claims to Invention.

BRIEF DESCRIPTION OF THE DRAWINGS

For a more complete understanding of the Objects of the Present Invention, the Detailed Description of the Illustrative Embodiments set forth below is to be read in conjunction with the accompanying drawings, wherein:

FIGS. 1A and 1B, taken together, show a high level flow chart illustrating the steps performed in the method of a implementing a digital logic design using a conventional FPGA device;

FIG. 2 is a set of the XNF statements for a single CLB Description in an exemplary FPGA netlist;

FIG. 7 is a schematic representation of the (logic cell) component placement map for the FPGA device shown in FIG. 6;

FIG. 8A is a set of the XNF statements for the File Name Description of an exemplary FPGA netlist;

FIG. 8B is a set of the XNF statements for a single CLB Description in an exemplary FPGA netlist;

FIG. 8C is a set of the XNF statements for a single IOB Description in an exemplary FPGA netlist;

FIG. 8D is a set of the XNF statements for a Clock Driver Description in an exemplary FPGA netlist;

FIG. 8E is a listing of the components in the FPGA, MPGA, and MPSC Libraries of the illustrated embodiments of the present invention;

FIG. 11A is a set of the LSL statements for the File Name Description of an exemplary MPGA netlist;

FIG. 11B is a set of the LSL statements for a single Soft-CLB Description in an exemplary MPGA netlist;

FIG. 11C is a set of the LSL statements for the Soft-CLB Connectivity Description in an exemplary MPGA netlist;

FIG. 11D is a set of the LSL statements for the Soft-IOB Connectivity Description in an exemplary MPGA netlist;

FIG. 11E is a set of the LSL statements for an A-Clock Distribution Tree Description in an exemplary MPGA netlist;

FIG. 11F is a set of the LSL statements for an G-Clock Distribution Tree Description in an exemplary MPGA netlist;

FIG. 11G is a set of the LSL statements for an Global Reset Distribution Tree Description in an exemplary MPGA netlist;

FIG. 11H is a set of the LSL statements for a CLB Load Description in an exemplary MPGA netlist description;

DETAILED DESCRIPTION OF THE ILLUSTRATIVE EMBODIMENTS OF THE PRESENT INVENTION

The method and machinery of the present invention will now be described in detail with reference to FIGS. 5 to 14.

In general, the method of the present invention can be used to convert any FPGA implementation into any desired MPLC implementation such as, for example, an MPGA or MPSC implementation. For purposes of illustration only, the method and machinery of the present invention will be described in connection with an exemplary digital logic design that has been originally implemented in either a Xilinx 2000 Series FPGA device, Xilinx 3000 Series FPGA device, or an AT&T 3000 Series FPGA device. In a first illustrative embodiment of the present invention, the method is used to convert the FPGA implementation into a functionally equivalent MPGA implementation realized using an AT&T Series ATT656 MPGA Library. In a second illustrative embodiment of the present invention, the method is used to convert the FPGA implementation into a functionally equivalent, MPSC implementation realized using an AT&T Series HS900C Library. It is understood, however, that the method and machinery of the present invention can be practiced using different types of FPGA and MPLC based devices.

Figure 5:
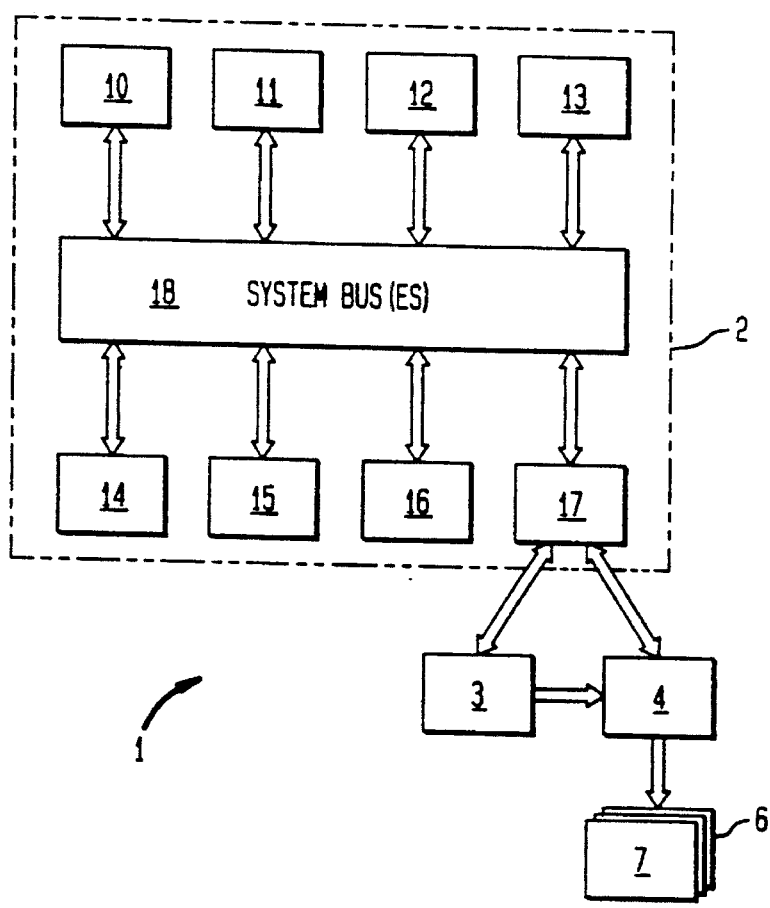
FIG. 5 is a system block diagram illustrating the components of the programmed machinery of the present invention.

As illustrated in FIG. 5, the machinery of the present invention 1 comprises a number of integrated subsystems, namely: a computer workstation 2, photolithic mask producing system 3, and metalization layer depositing system 5. Specifically, the primary function of workstation 2 is to perform logic synthesis and resynthesis, component placement and routing, and other functions to be described hereinafter. The function of system 3 is to produce photolithic mask works 4. The primary function of system 5 is to use these produced masks in order to form metalization patterns 6 on "MPGA substrates" (and MPSC substrates) 7.

As used hereinafter, it is understood that each "MPGA substrate" has been preprocessed up to the "metalization stage". In this stage of material processing, the location of each logic gate is predefined, and all that is required to program the MPGA device is to form on the substrate: (i) electrical interconnections for signal routing purposes; and (ii) clock lines for the A-CLK and G-CLK Distribution Trees and the Global Reset Distribution Tree. In order to form these structures by way of conventional metalization processes, it is necessary to first determine the physical dimensions (i.e., areas) and location of these electrical interconnections, and the physical dimensions and location of the clock lines over the surface of the MPGA substrate. As will be described below, this required information is ultimately produced upon completion of the conversion process.

As shown in FIG. 5, the workstation 2 comprises a number of integrated system components, namely: one or more central processing units 10 (e.g., microprocessor); program memory storage 11 for storing an operating system program, application programs, and various development and conversion programs (i.e., tools) of the present invention; random access data storage memory (RAM) 12 for storing various data structures utilized during the design and conversion processes; a mass-type data storage memory 13 for storing information regarding the components in the LCA (i.e., FPGA) Library, the MPGA Library, and the MPGA geometrical database; a visual display unit 14 having a visual display screen or surface; a keyboard or other text input device 15; a pointing and selecting device (e.g., mouse or track-ball) 16; and one or more system interfaces 17 for interfacing with mask-generating and metalization depositing machines 3 and 5. As illustrated, each of these system components is operably associated with processor 10 by way of one or more system buses 18 in a manner known in the art. In the preferred embodiment, the operating system is Unix® X-Windows, allowing the processor to support at least two input/output windows, pointing and selecting device 16, and multi-tasking operations. It is understood, however, that other suitable operating system programs can be used with acceptable results.

Figure 6A:
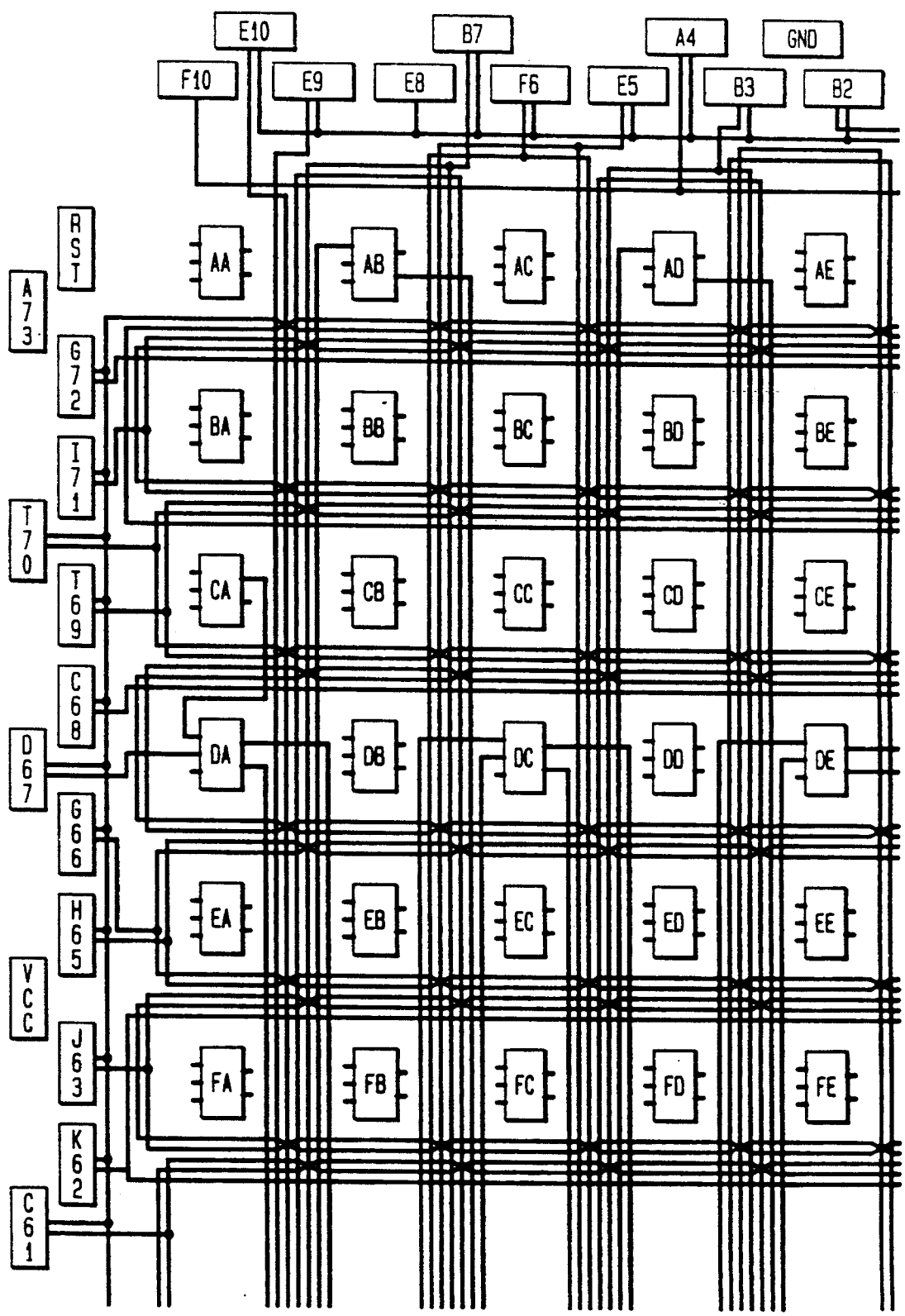
FIG. 6 is a schematic diagram of an exemplary FPGA device, showing the configurable logic blocks and the input and output interface blocks interconnected at the network level via programmable interconnect switches.
Figure 6B:
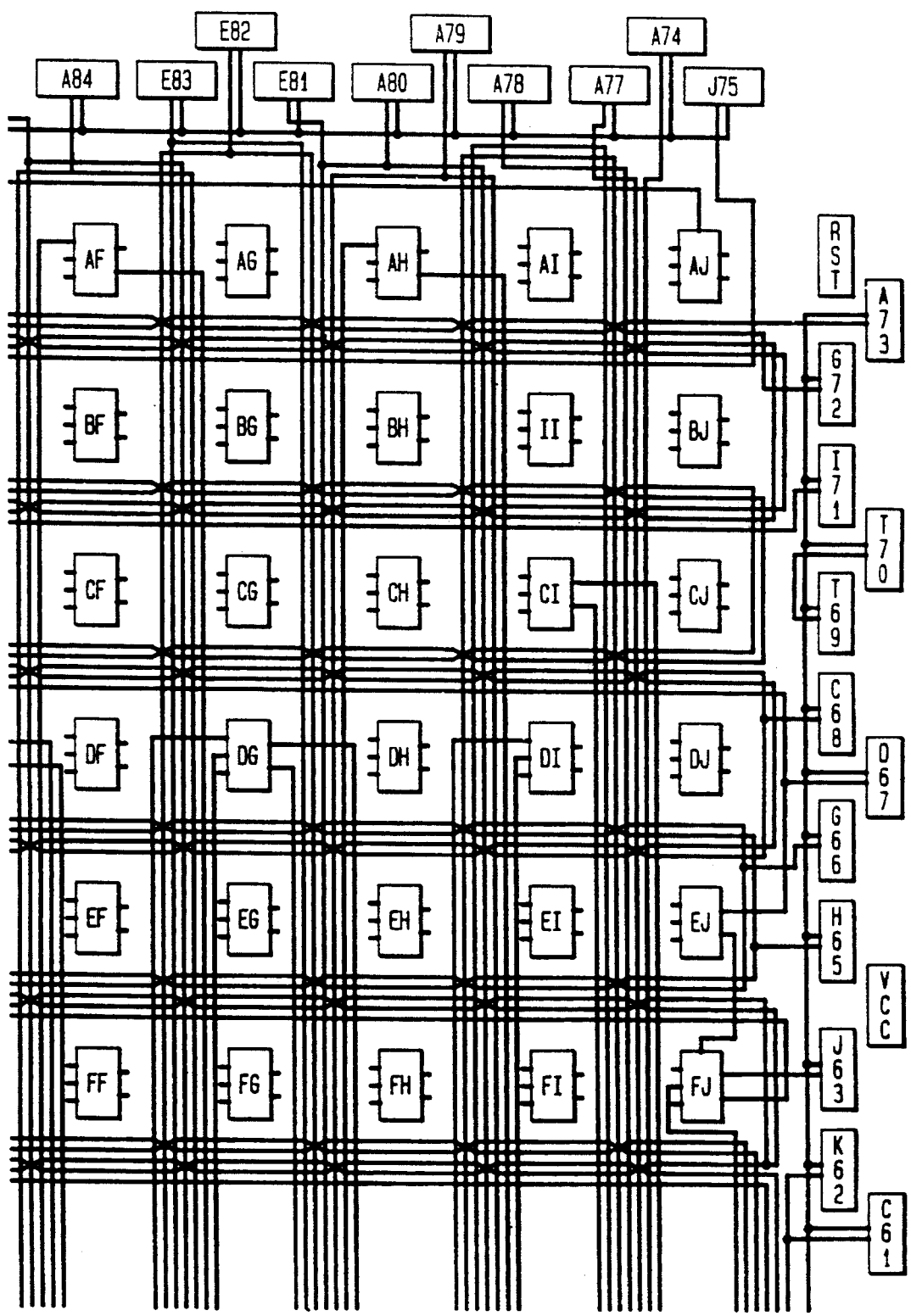
Figure 6D:
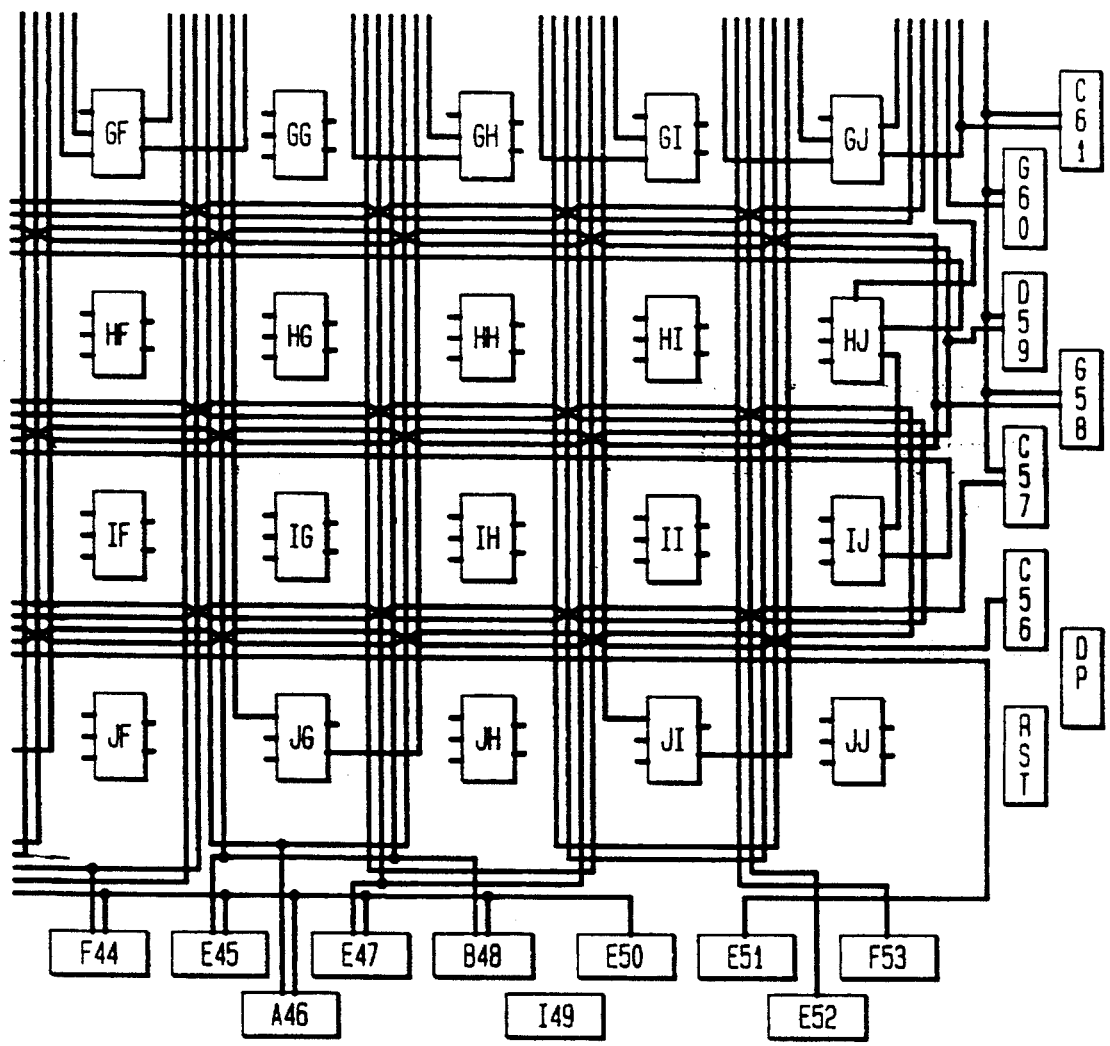
Figure 8:
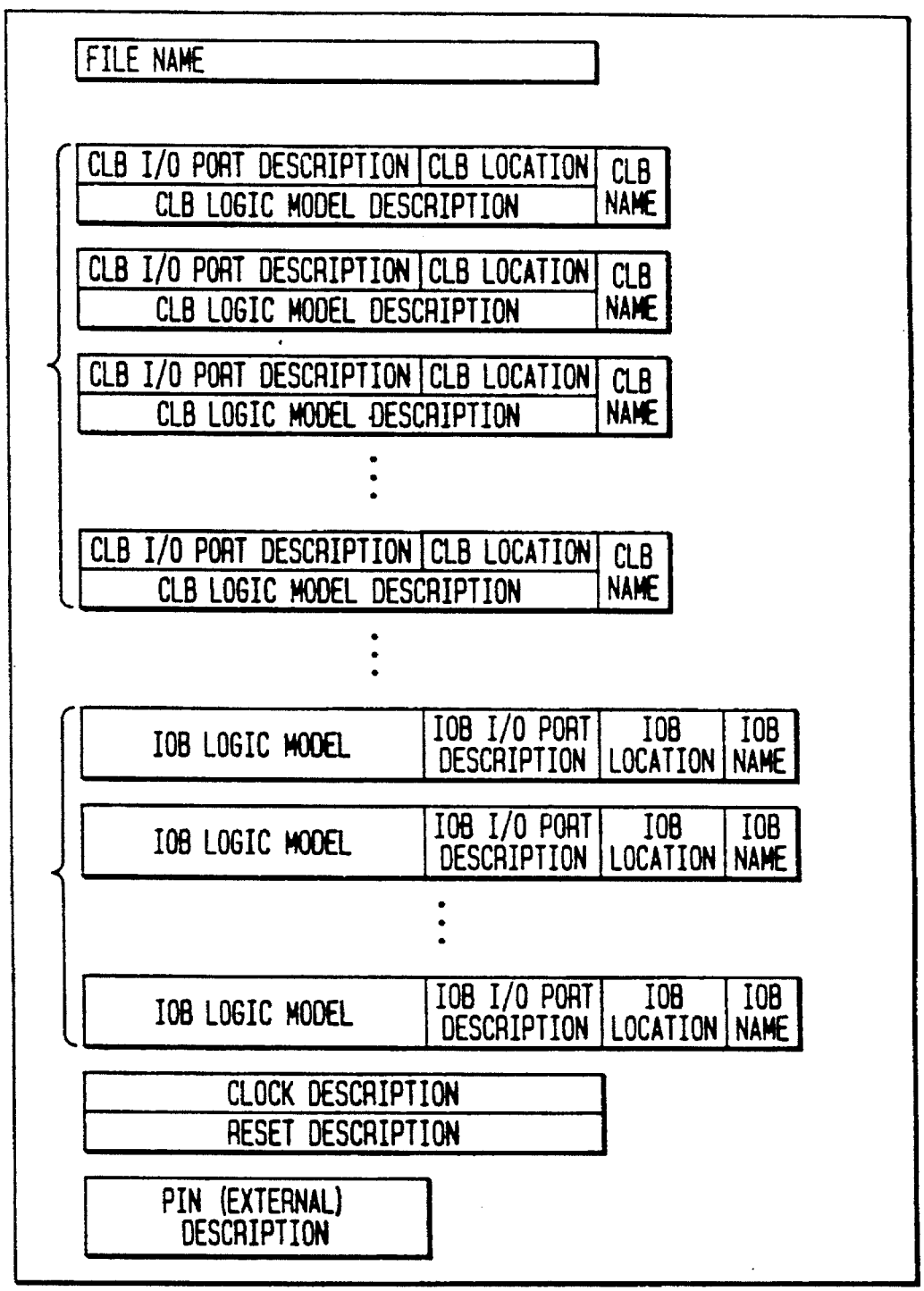
FIG. 8 is a schematic representation showing the elements of an FPGA netlist for a FPGA implementation of a particular digital logic design.

As shown in FIG. 6, FPGA device 20 of the illustrative embodiment comprises an array of CLBS formed on a silicon substrate. In order to provide interconnections between the pins on the chip package of the FPGA device and the input and output ports of the selected CLBs, a ring of IOBs is formed about the CLB array on the FPGA substrate. In the illustrated embodiment, each CLB has both combinational and sequential logic which can be selectively configured as required, by simply programming the RAM associated with the CLB. Similarly, each IOB has both combinational and sequential logic which can be selectively figured as required by simply programming the RAM associated with the IOB.

In FIG. 7, there is shown a logic cell map for the FPGA device of the illustrative embodiment. As illustrated, each CLB is assigned a specific location on the silicon substrate which is specified by a row and column address, e.g., AA, BD, etc., as shown. Similarly, each location of IOB is identified by a perimeter address specified by pin number, e.g., P21.

Figure 9:
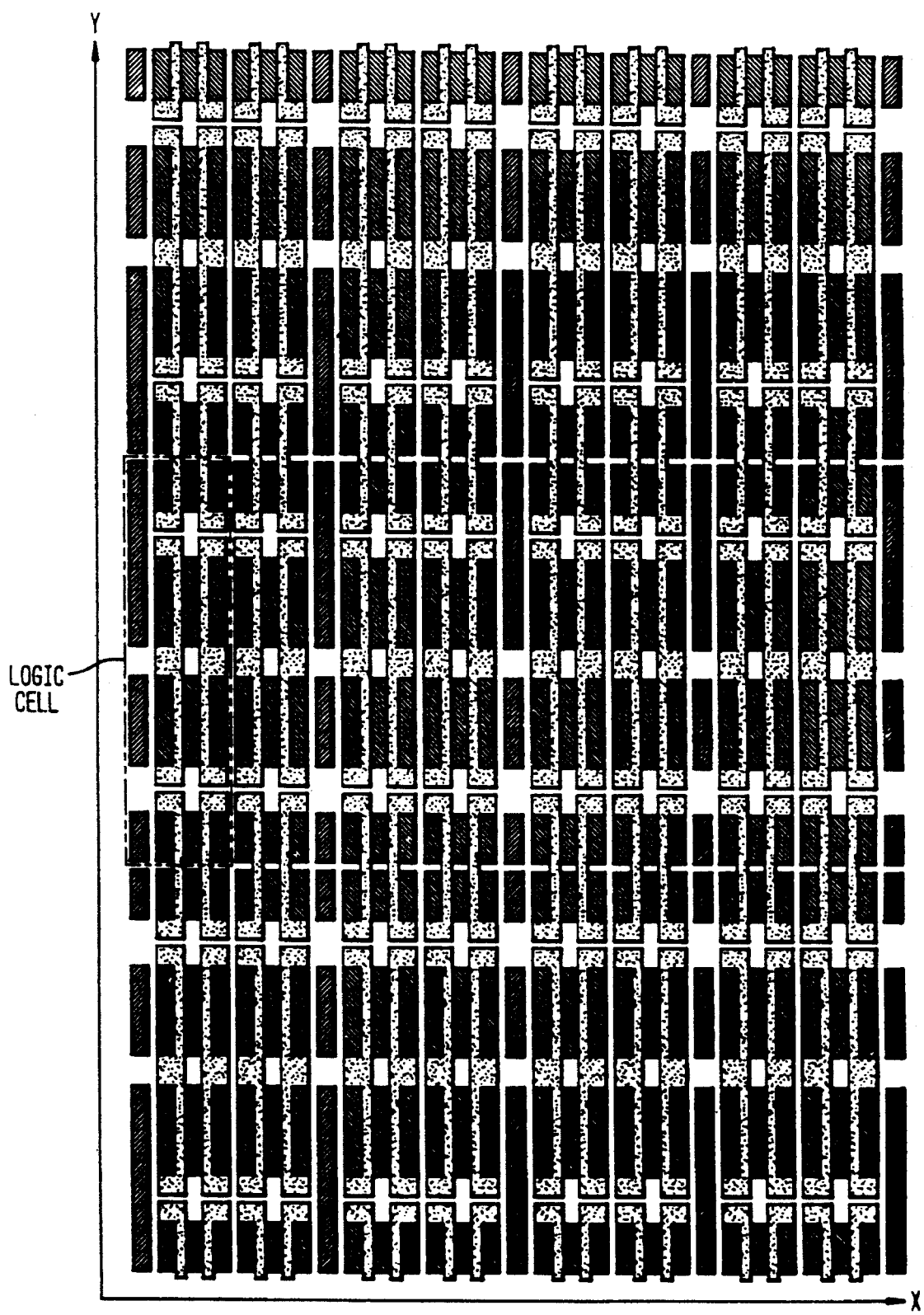
FIG. 9 is a geometrical plan view of a MPGA substrate preprocessed up to the metalization stage.

In FIG. 9, there is shown a Cartesian (x-y) coordinate system embedded within the plane of a MPGA substrate preprocessed up to the metalization stage. As shown, the physical location of each logic cell (logic gate) on the MPGA substrate is specified by a range of x and y values. Typically, it is necessary to interconnect a number of logic gates on the MPGA substrate in order to realize equivalent logic functions performed by a particular CLB in the FPGA implementation. In the MPGA implementation, this block of logic does not have hard or physically defined boundaries as does its corresponding CLB in the FPGA implementation, and thus it shall be referred to hereinafter and in the claims as a "Soft-CLB", to indicate its virtual character. In accordance with the present invention, a network (i.e., interconnect) level is defined for the MPGA implementation, and although there are no physical boundaries at the network level of the MPGA implementation, as there is in the case of the FPGA implementation, each Soft-CLB has predefined input and output ports at the network (or interconnect) level. For purposes of practicing the method of present invention, these input and output ports are specified in the Soft-CLB Connectivity Description in the MPGA netlist, shown in FIG. 11C.

Similarly, in the MPGA implementation, the equivalent structure for an IOB does not have hard or physically defined boundaries as does its corresponding IOB in the FPGA implementation. Thus the equivalent structure for an IOB in the MPGA implementation shall be referred to hereinafter and in the claims as a "Soft-IOB", to indicate its virtual character. Thus, for each IOB in the netlist of the FPGA implementation, a "Soft-IOB" is defined in the MPGA netlist. In most implementations, the Soft-IOB is realized by an I/O pad, and sometimes with simple logic level drivers. Also, while combinational and/or sequential logic functions are infrequently required in most common applications, these functionalities are available in most MPGA Libraries. At the network or interconnect level of the MPGA implementation, each Soft-IOB has predefined input and output ports for purposes of practicing the method of present invention. These input and output ports are specified in the Soft-IOB Connectivity Description in the MPGA netlist, shown in FIG. 11D.

Figure 13A:
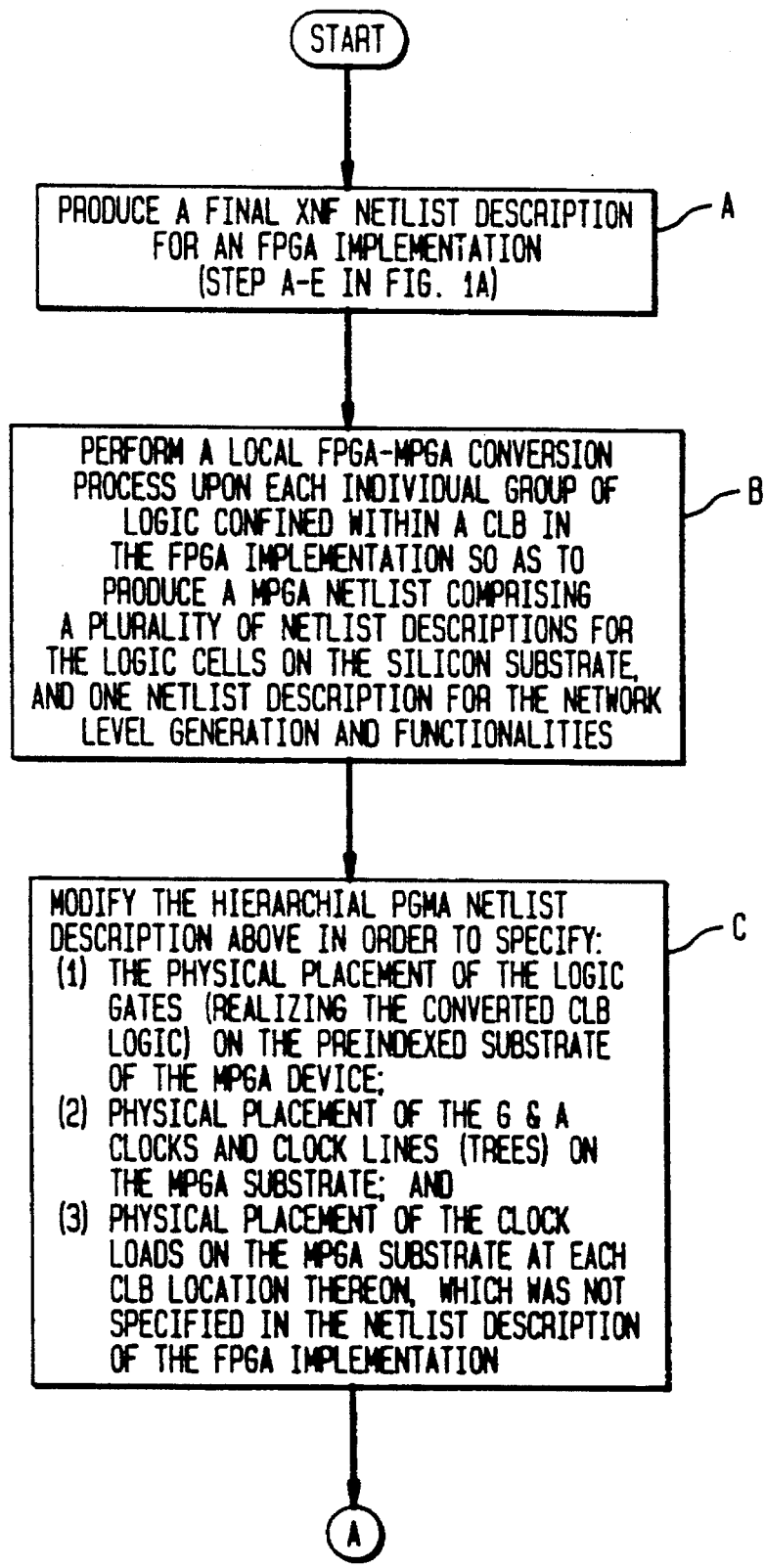
FIGS. 13A and 13B, taken together, show a high level flow chart illustrating the steps performed in the process of converting a FPGA implementation into a MPGA implementation using the method of the present invention.
Figure 13B:
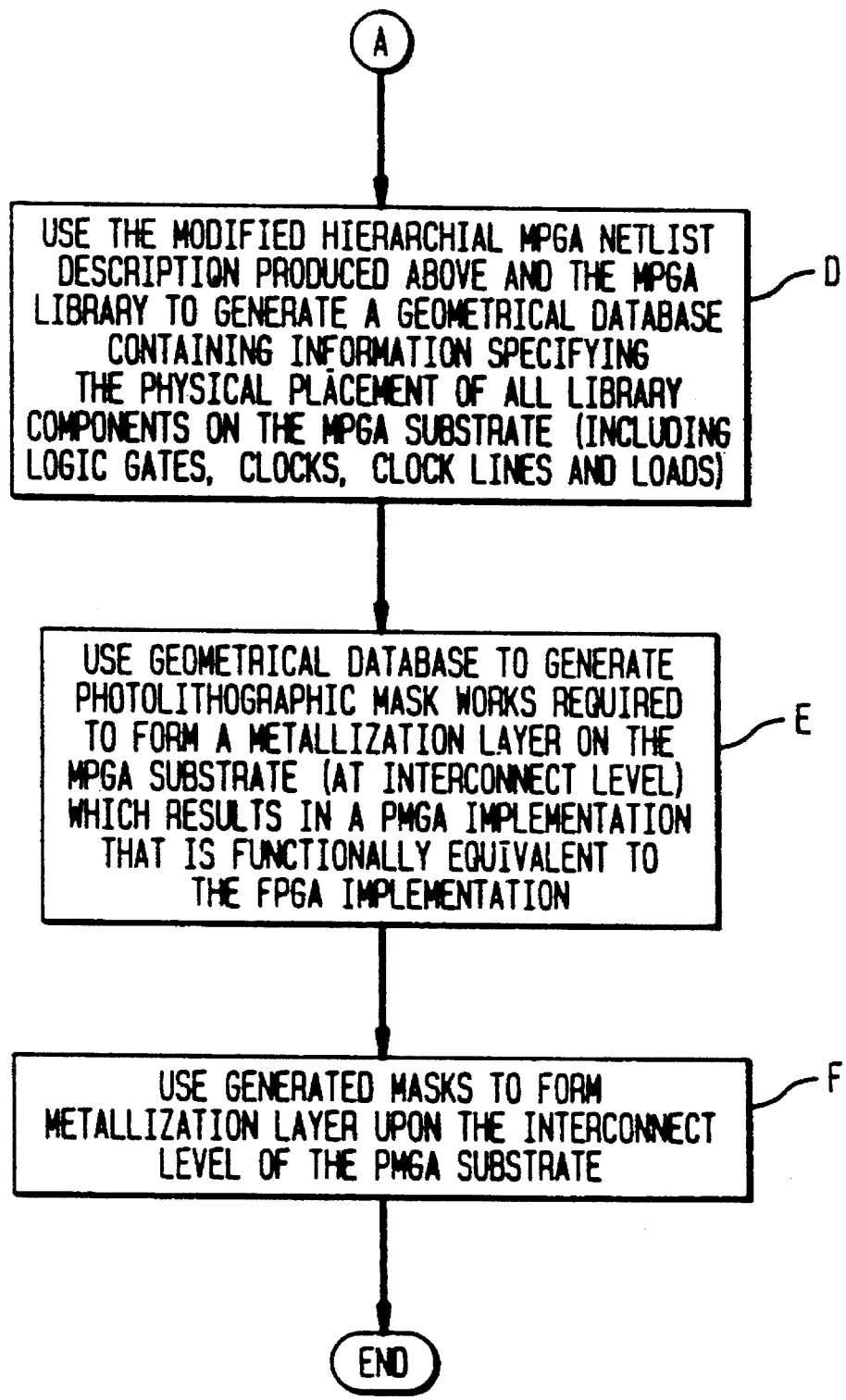

Referring to FIGS. 13A and 13B, the conversion method of the present invention will now be described in great detail.

Figure 1B:
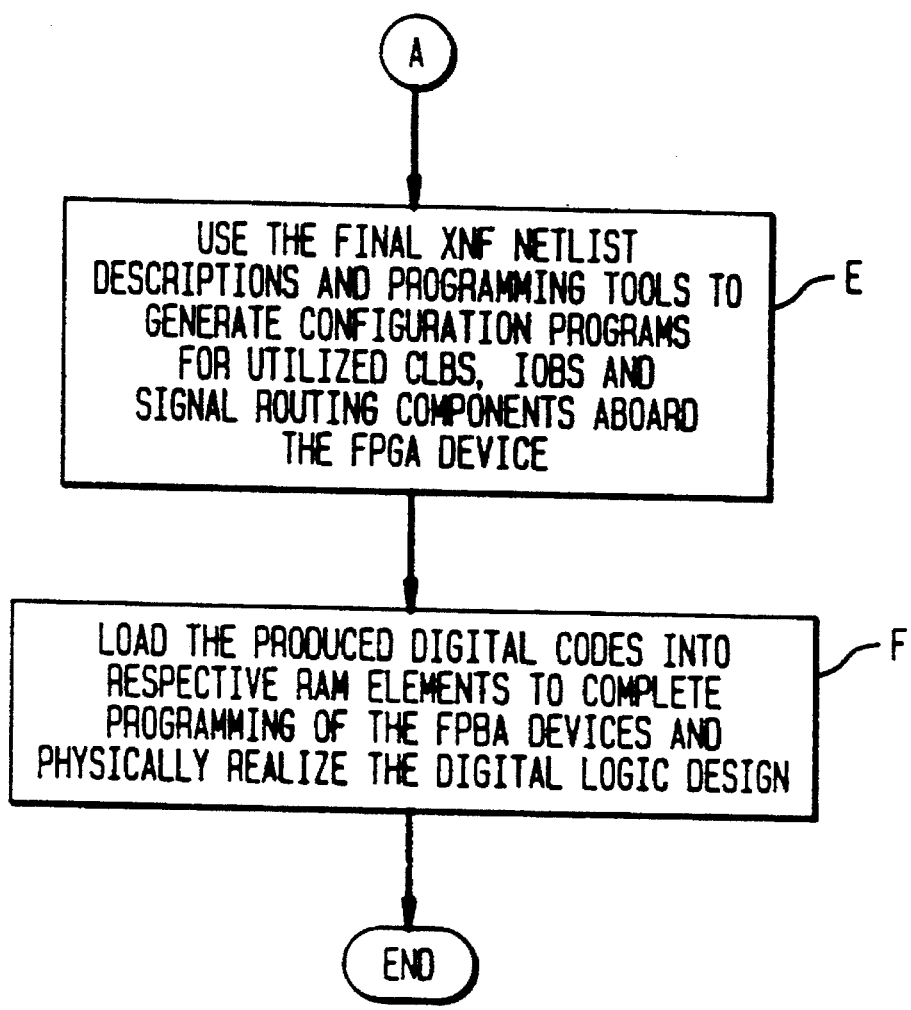
Figure 3:
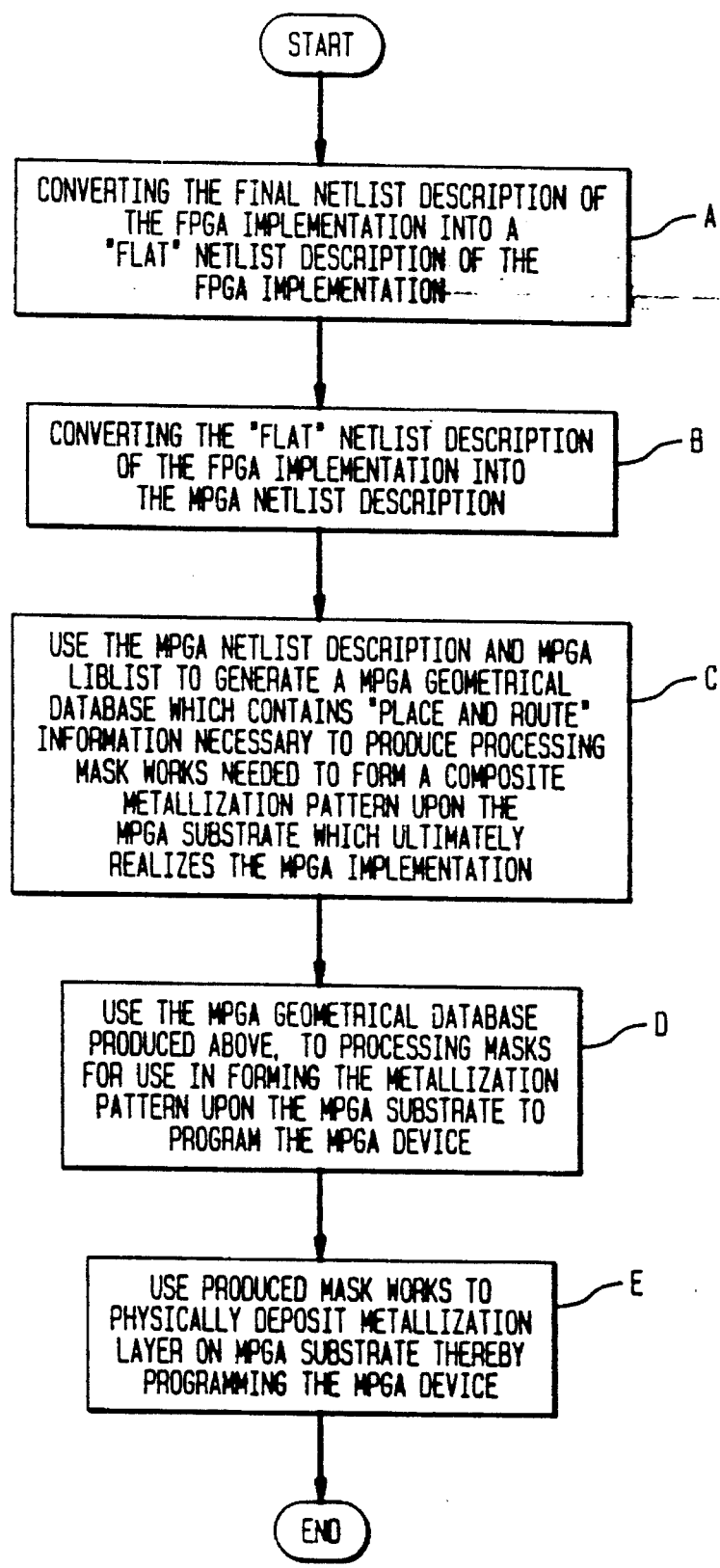
FIG. 3 is a high level flow chart illustrating the steps performed during the process of converting a FPGA implementation into a MPGA implementation using a prior art methodology.
Figure 4:
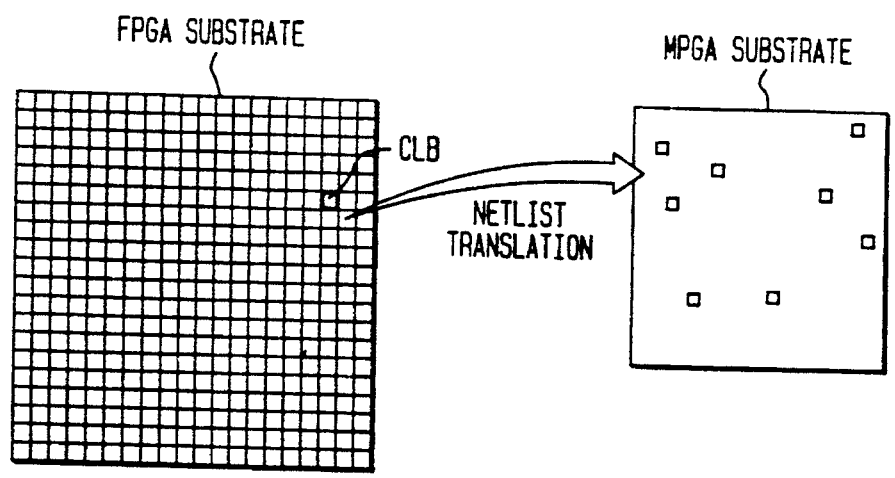
FIG. 4 is a schematic representation illustrating the prior art process of mapping logic cells in a FPGA implementation into functionally equivalent logic cells in a MPGA implementation using the prior art methodology described in FIG. 3.

As indicated at Block A in FIG. 13A, the first step of the method involves performing the present steps shown at Blocks A to D in FIG. 1, in order to produce a final FPGA (XNF) netlist for the FPGA implementation which is to be converted. Notably, the resulting netlist description of this FPGA implementation contains hierarchical information regarding the physical placement of the combinational logic blocks (CLB) on the silicon substrate of the FPGA device. The exemplary FPGA netlist produced from this stage of the conversion process is schematically illustrated at FIG. 10.

Figure 10:
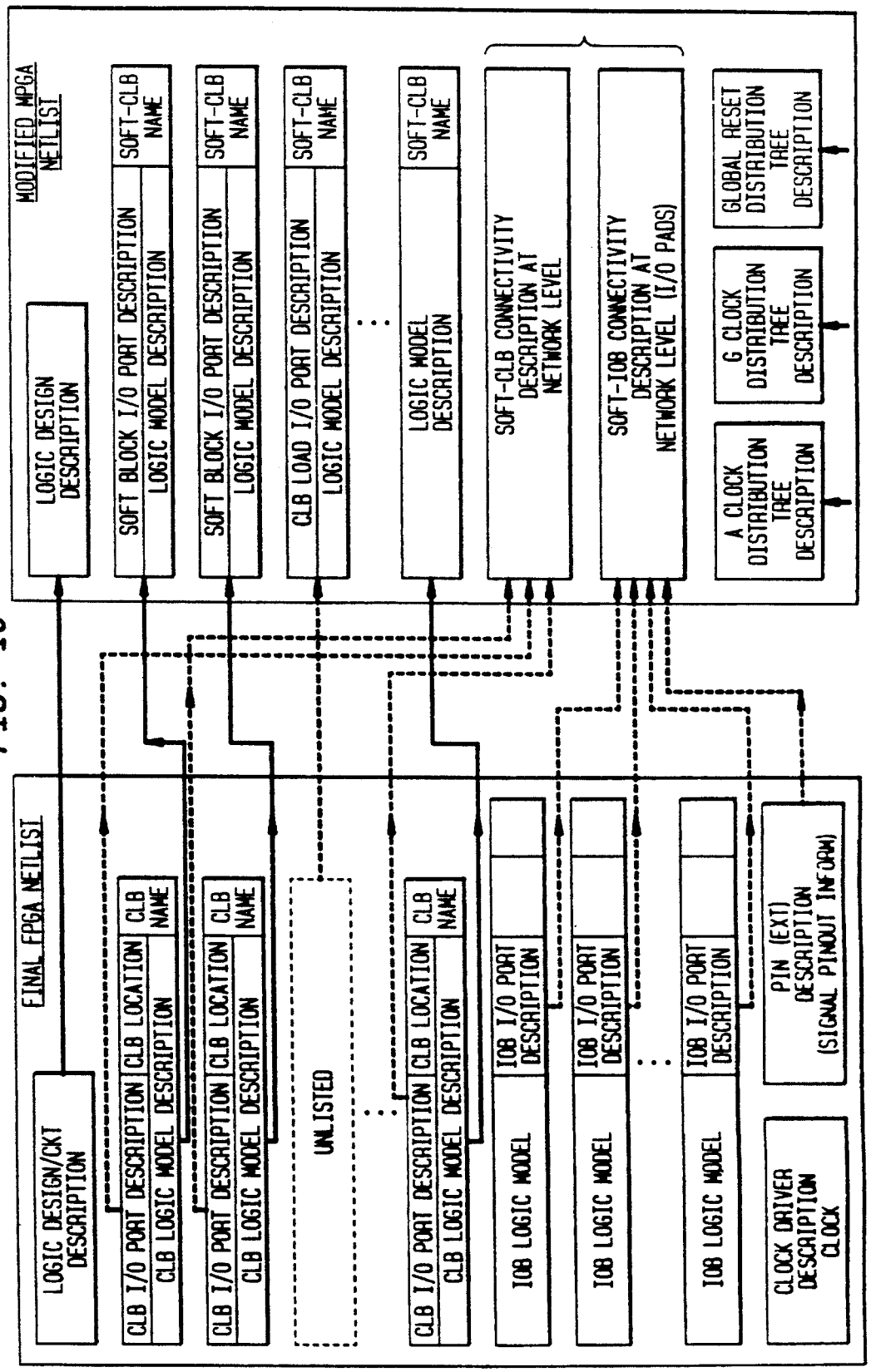
FIG. 10 is a schematic representation illustrating the process of producing a modified MPGA netlist description from an FPGA netlist of a FPGA implementation for a particular digital logic design.

As shown in FIG. 10, the FPGA netlist contains a number of component descriptions, namely: a file or circuit name; a CLB description for each CLB used in the FPGA implementation; an IOB description for such IOB used in the FPGA implementation; a clock driver description for the clocks used is the FPGA implementation; and a signal pinout description for the pins on the chip package.

In general, each CLB description contains a number of informational items, namely: a CLB name; a CLB I/O port description expressed in terms of signal names (e.g., IBLANE_1); a CLB location description (e.g., AA) expressed in terms of the logic cell array location shown in FIG. 7; and a CLB Logic Model description which describes the FPGA library components used to realize the CLB. Notably, the description of each input port to each CLB includes a signal time-delay field which contains signal routing delay information regarding the signal route portion between the input port of the CLB and the source of the signal provided to the CLB. This signal routing delay information is typically generated by a computer-based "layout" tool well known in the art, and is used during circuit design simulations conducted in a manner well known in the art.

Also, each IOB description contains a number of informational items, namely: an IOB Name; IOB location on the substrate expressed in terms of a pin number; an IOB I/O port description expressed in terms of a signal name (e.g., IBLANE_1); and an IOB Logic Model description expressed in terms of FPGA Library components. At the network level of the FPGA implementation, each individual group of logic is defined by its CLB name (e.g., IRELAY_1), and is described by a set of XNF statements listed in the FPGA XNF netlist. Notably, the description of each input port of each IOB that is configured as an output driver, includes a signal time-delay field which contains signal routing delay information regarding the signal route portion between the IOB and the source of the signal provided to IOB. This signal routing delay information is also generated by computer-based "layout tool" described above, and is also used during circuit design simulations. For the AT&T 3020 Series FPGA device having 64 Logic Cells, the hierarchical FPGA XNF netlist contains up to 64 CLB descriptions, 60 IOB descriptions, a clock driver description, and a signal pin-out description. While not shown, sets of XNF statements are used to realize each of the descriptive elements specified in the FPGA netlist shown in FIG. 10. The XNF format for such statements is exemplified in the CLB description of FIG. 8A.

As indicated at Block B in FIG. 13A, the next step of the method involves locally performing "logic resynthesis" upon each individual group of logic defined by its CLB Name in the FPGA netlist description (i.e., confined within the CLB in the FPGA implementation). Any conventional logic synthesis technique may be used. This step begins the translation of the FPGA XNF netlist into a MPGA LSL netlist as schematically illustrated in FIG. 10. For a FPGA implementation using the AT&T Series 3020 FPGA device (having 64 Logic Cells), this step of the conversion process yields a "hierarchical" MPGA netlist comprising a number of component descriptions, namely: a file or circuit name which corresponds to the name of the file name selected for the FPGA netlist; a Soft-CLB description for each CLB utilized in the FPGA implementation; a Soft-IOB description for each IOB utilized in the FPGA implementation; a Soft-CLB Connectivity description as described above; and a Soft-IOB Connectivity description as described above. Notably, the A-CLK Signal Distribution Tree description, the G-CLK Signal Distribution Tree description, and a Global Reset Signal Distribution Tree description shown in the MPGA netlist of FIG. 10 are not produced during this stage of the conversion process, but rather must be manually added to the netlist during step C to be described below.

As illustrated in FIG. 10, each Soft-CLB description contains a number of informational items, namely: a Soft-CLB I/O description describing the input and output ports thereof; a Soft-CLB Name, which is the same as the location of the corresponding CLB in the FPGA implementation; and a Logic Description Model for each Soft-CLB, specifying the resythesized logic components comprising the subnetwork of the corresponding CLB. The soft-CLB connectivity Description in the MPGA Netlist contains a listing of the Soft-CLBs in the network and a specification for the interconnections of the input and output ports thereof at the network level of the MPGA implementation. Notably, these port interconnections are expressed in terms of signal names (e.g., X00228X illustrated in FIG. 11C). Similarly, the Soft-IOB connectivity description in the MPGA netlist contains a listing of the Soft-IOBs in the network and a specification for interconnections of the input and output ports thereof at the network level of the MPGA implementation. These port interconnections are also expressed in terms of signals illustrated in FIG. 11D. The sets of Logical Simulation Language (LSL) statements used to realize each of these descriptions in the produced MPGA netlist are set forth in FIGS. 11A to 11D.

Figure 12:
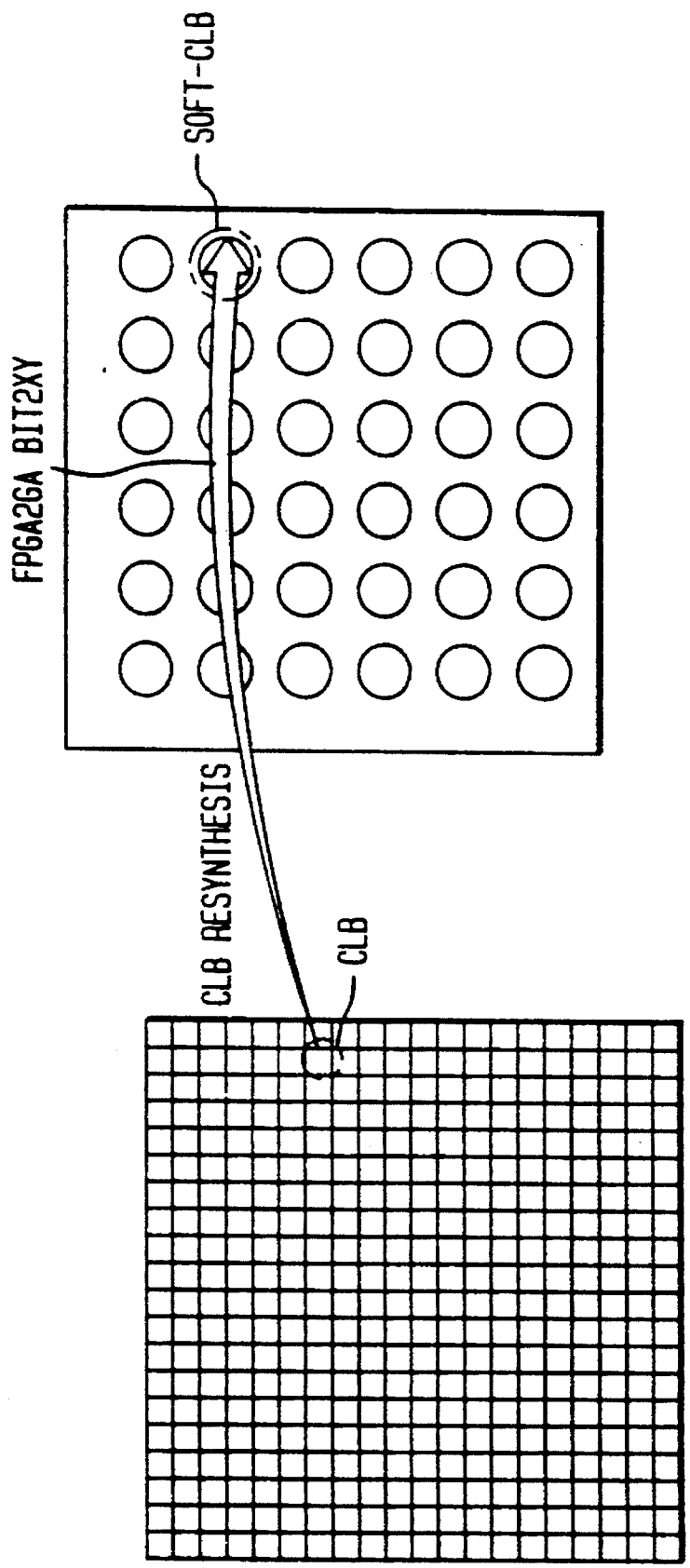
FIG. 12 is a schematic representation illustrating the process of mapping a FPGA implementation into a MPGA implementation using the methodology of the present invention.

During the logic resynthesis step graphically illustrated for a CLB in FIG. 12, the same XNF code that is used to specify the location of a CLB in the FPGA netlist, is used to specify the Soft-CLB name of its corresponding Soft-CLB in the MPGA netlist. By using the same code to coindex (i) the logic contained within a particular CLB (i.e., subnetwork) in the FPGA netlist and (ii) the resynthesized logic contained within the corresponding Soft-CLB in the MPGA netlist, the method of the present invention guarantees that corresponding blocks of logic in the MPGA implementation are correctly identified and physically placed in the same relative location on the MPGA substrate, during the "placement and routing" step below. As shown in FIG. 10, the CLB Logic Model Description for a particular CLB is used to resynthesize the logic in the corresponding Soft-CLB on the MPGA substrate.

As indicated at Block C in FIG. 13A, the third step of the method of the present invention involves modifying the hierarchical MPGA netlist produced during step B above, in order to specify (i.e., list) four additional items of information which relate to particular structures that are required in order to carry out the MPGA implementation in accordance with the present invention. As illustrated in the netlist of FIG. 10, these additional structures are identified as the A-CLK Signal Distribution Tree, the G-CLK Signal Distribution Tree, the Global Reset Signal Distribution Tree, and CLB Clock Loads which are to be formed on the MPGA substrate.

The first informational item to be added to the MPGA netlist is a LSL netlist description for the A-CLK Signal Distribution Tree to be realized on the MPGA substrate. As illustrated in LSL statements realizing the A-CLK Signal Distribution Tree description shown in FIG. 11E, each column line in the A-CLK Signal Distribution Tree has a clock driver synthesized from available components (e.g., F102) in the MPGA Library. In the exemplary embodiment, the Tree has 10 columns and thus 10 clock drivers are specified in LSL statement of the A-CLK Signal Distribution Tree.

The second informational item to be added to the MPGA Netlist is a LSL netlist description for the G-CLK Signal Distribution Tree to be realized on the MPGA substrate. As illustrated in FIG. 11F, each column line in the G-CLK Signal Distribution Tree has a clock driver synthesized from available components (e.g., F102) in the MPGA Library. In the exemplary embodiment, the Tree has 10 columns and thus 10 clock drivers are specified in the LSL statement of the G-CLK Signal Distribution Tree.

The third informational item to be added to the MPGA Netlist is a LSL netlist description for the Global Reset Signal Distribution Tree to be formed on the MPGA substrate. As illustrated in FIG. 11G, each column line in the Global Reset Signal Distribution Tree has a clock driver synthesized from available components (e.g., F102) in the MPGA Library. In the exemplary embodiment, the Tree has 10 columns and thus 10 drivers are specified in the LSL statement for the Global Reset Signal Distribution Tree.

The fourth informational item to be added to the MPGA netlist is a LSL description for the CLB Clock Load to be formed on the MPGA substrate for each CLB that was not specified in the FPGA netlist. As illustrated in FIG. 11H, each of these Soft-CLB Loads has input and output ports and a subnetwork description which specifies, at the network (i.e., interconnect) level of the MPGA implementation, the interconnections among the ports of the Soft-CLBs and the lines of either the A-CLK and/or the G-CLK Signal Distribution Trees. Each input port in each soft-CLB is represented by a logic gate which introduces into the clock signal routing network, an impedence (i.e., load) that is substantially equal to the impedence presented to (i.e., "seen by") the associated clock driver in the FPGA implementation. Typically, each CLB Load is specified in terms of a "distributed" type capacitance and/or resistance measures which are well known in the art. As will be explained in greater detail hereinafter, the purpose of introducing such impedence measures is to ensure that impedance seen by the clock signal drivers in the FPGA implementation, are substantially the same as the impedance measure seen by the clock signal drivers in the MPGA implementation, thereby preserving clock signal skews (and thus, logic functions) between the implementations. Notably, while each CLB load introduces a desired load in the clock signal routing network in the MPGA implementation, the CLB loads do not, however, present any loading effects upon (I/O) signals passing through the (I/O) signal routing network realized at the interconnect level of the MPGA implementation, as their corresponding CLB in the FPGA implementation are not connected to the (I/O) signal routing network formed in the FPGA device.

The result of the above four substeps in the method hereof results in a modified hierarchical MPGA netlist for the MPGA implementation. Notably, the resulting MPGA netlist does not contain information regarding the physical placement of the MPGA Library components, or the physical routing of the A-CLK, G-CLK, and Global Reset Signal Distribution Trees described in the MPGA netlist.

As indicated at Block D in FIG. 13B, the next step of the method of the present invention involves using the modified hierarchical MPGA netlist produced above and the MPGA Library in order to generate a geometrical database. The function of this geometrical database is to specify where on the MPGA substrate, all of the library components, including the logic gates, clock drivers, clock lines, and Soft-CLB Loads described in the modified MPGA netlist of FIG. 10 are to be physically realized. In general, this process of generating placement and routing information is performed by a "Place and Route" program which uses (i) information specified in the particular component descriptions of the modified MPGA netlist and (ii) geometrical information regarding these particular components specified in the MPGA Library, in order to compute the exact physical placement of each such component on the MPGA substrate, shown in FIG. 9.

For each Soft-CLB and CLB Clock Load described in the modified MPGA netlist, the Place and Route program produces a range of x and y coordinates (i.e., geometrical data) which specify a particular area (i.e., region) on the MPGA substrate where logic gates are to be interconnected by a metalization pattern in order to realize the resynthesized combinational and/or sequential logic within the Soft-CLB. The procedure by which this set of coordinate data is computed employs the CLB location (e.g., AA) of the CLB and an offset parameter in order to map the row, column indices of the FPGA substrate, into a spatially corresponding set of x, y coordinates on the MPGA substrate. This one-to-one coordinate conversion process is schematically illustrated in FIG. 12, and is most significant in ensuring that each Soft-CLB is placed in relatively the same location on the MPGA substrate, as its corresponding CLB on the FPGA substrate. This mapping condition guarantees that the same clock signal skews that occur in the MPGA implementation, are relatively the same as those which occur in the FPGA implementation, thus assuring functional equivalence in the resynthesized logic at the network level of MPGA implementation.

For each Soft-CLB described in the Soft-CLB Connectivity Description of the MPGA netlist, the program generates a range of x and y coordinates that define the physical placement of metallic interconnections among the input and output ports of the Soft-CLBs at the network level of the MPGA implementation. The procedure by which this set of coordinate data is computed employs the IOB location (e.g., pin number P21) of the IOB and an offset parameter in order to map the pin number on the perimeter of the FPGA substrate, into a spatially corresponding set of x, y coordinates on the perimeter of the MPGA substrate. This is one-to-one coordinate conversion process as schematically illustrated in FIG. 12, and it is also critical in ensuring that each Soft-IOB is placed in relatively the same location on the MPGA substrate, as its corresponding IOB on the FPGA substrate. By maintaining this condition throughout the conversion process, it is thus possible to ensure that the (I/O) signal delays aboard the MPGA implementation are relatively the same as those which occur aboard the FPGA implementation.

For each of the drivers in the A-CLK Signal Distribution Tree description, the Place and Route program generates a range of x and y coordinates that specify the physical placement of the clock driver and the metallic clock distribution branch extending from the clock driver to each of the Soft-CLBs and CLB Loads described in the MPGA netlist. The procedure by which this set of coordinate data is computed for each clock driver and distribution branch employs the drivers' name and an empirically determinable offset parameter in order to map the location of each clock driver on the FPGA substrate, into a spatially corresponding set of x, y coordinates on the perimeter of the MPGA substrate. The procedure also uses the driver's name and offset parameters to map the location of the branches of the A-CLK Signal Distribution Tree on the FPGA substrate, into a set of spatially corresponding x,y coordinates on the MPGA substrate. This is also one-to-one coordinate conversion process and it is also critical in ensuring that each clock driver and its associated clock pulse distribution branch is placed in relatively the same location on the MPGA substrate, as its corresponding clock driver and its associated clock pulse distribution branch on the FPGA substrate.

For each of the drivers in the G-CLK Signal Distribution Tree description, the Place and Route program generates a range of x and y coordinates that specify the physical placement of the clock driver and the metallic clock distribution branch extending from the clock driver to each of the Soft-CLBs and CLB Loads described in the MPGA netlist. The procedure by which this set of coordinate data is computed for each clock driver and distribution branch employs the drivers' name and an empirically determinable offset parameter in order to map the location of each clock driver on the FPGA substrate, into a spatially corresponding set of x, y coordinates on the perimeter of the MPGA substrate. The procedure also uses the driver's name and offset parameters to map the location of the branches of the G-CLK Signal Distribution Tree on the FPGA substrate, into a set of spatially corresponding x, y coordinates on the MPGA substrate. This is also one-to-one coordinate conversion process and it is also critical in ensuring that each clock driver and its associated clock pulse distribution branch is placed in relatively the same location on the MPGA substrate, as its corresponding clock driver and its associated clock pulse distribution branch on the FPGA substrate. Maintaining this condition throughout the conversion process, ensures that the clock signal delays aboard the MPGA implementation are relatively the same as those which occur aboard the FPGA implementation.

For each of the drivers in the Global Reset Signal Distribution Tree description, the Place and Route program generates a range of x and y coordinates that specify the physical placement of the driver and the metallic clock distribution branch extending-from the driver to each of the Soft-CLBs and CLB Loads described in the MPGA netlist. The procedure by which this set of coordinate data is computed for each clock driver and signal distribution branch employs the drivers' name and an empirically determinable offset parameter in order to map the location of each driver on the FPGA substrate, into a spatially corresponding set of x, y coordinates on the perimeter of the MPGA substrate. The procedure also uses the driver's name and offset parameters to map the location of the branches of the Global Reset Signal Distribution Tree on the FPGA substrate, into a set of spatially corresponding x, y coordinates on the MPGA substrate. This is also one-to-one coordinate conversion process, and it is also helpful in ensuring that each driver and its associated signal signal distribution branch is placed in relatively the same location on the MPGA substrate, as its corresponding driver and associated signal distribution branch are placed on the FPGA substrate. Since most Global Reset mechanisms are asynchronous in operation, it is not necessary to control the reset signal "skews" to the same degree necessary for the clock signals in the MPGA implementation. However, the use of a reset signal distribution tree with multiple drivers, as in the present invention, is preferred over the use of a single reset signal driver and a random reset signal routing network, as used in prior art implementations.

Maintaining the above-described conditions throughout the conversion process, ensures that the clock delays aboard the MPGA implementation are relatively the same as those which occur aboard the FPGA implementation.

All of the coordinate information produced during the Place and Routing step above is organized in a number of files stored in memory 13 to form a geometrical database. In essence, this database contains sufficient coordinate data that precisely specifies the physical dimensions and placement of several metalizations sub-patterns that are to be formed upon the preprocessed MPGA substrate.

As indicated in Block E in FIG. 13B, the next step of the method involves providing to system 3 with the geometrical information contained in the files of the geometrical database produced at Block E. Using such geometrical information, system 3 generates a number of photo-lithographic processing masks 4 for use in forming a metalization layer at the interconnect level of a preprocessed MPGA substrate. In effect these metalization layers, together, program the preprocessed MPGA substrate to produce a MPGA implementation characterized by the logical functions described in the modified MPGA netlist.

At Block F in FIG. 13B, the last step of the method of the present invention involves system 5 using the photo-lithographic processing mask(s) 4 produced at Block F in order to form a metalization layer upon a preprocessed MPGA substrate. As mentioned, this final stage of material processing results in a MPGA implementation that is functionally equivalent to the FPGA implementation.

The present invention can also be used to convert a FPGA implementation into a MPSC implementation by simply modifying the above-described method as follows.

At Block B in FIG. 13A, the method of the present invention uses a MPSC Library in lieu of the MPGA Library. This modification results in a MPSC netlist having Soft-CLB descriptions, Soft IOB descriptions, and a Soft IOB Connectivity description essentially the same as in the MPGA embodiment. In addition, the MPSC netlist includes a Soft-CLB Connectivity description which contains not only port connectivity information at the network level, but also port connectivity information at one or more subnetwork levels in the MPSC implementation. At Block C in FIG. 13A, the MPSC netlist is modified in a manner described above. During placement and routing at Block D in FIG. 13B, all of the structures listed in the modified MPSC netlist are either physically placed or routed on the MPSC substrate in a manner essentially same as described above, to produce a geometrical database for the MPSC implementation. Then at Block E, the geometrical database is used to produce sets of processing masks for the predefined network and subnetwork levels of the MPSC implementation. At Block F, these processing masks are utilized to form a composite metalization layer on the MPSC substrate sufficient to physically realize a MPSC implementation that is functionally equivalent to the FPGA implementation.

The method and apparatus of the present invention has shown to be most useful in converting FPGA implementations of digital logic designs into MPLC implementations of such digital logic designs. It is understood, however, that various modifications to the illustrative embodiments of the present invention will readily occur to persons with ordinary skill in the art. All such modifications and variations are deemed to be within the scope and spirit of the present invention as defined by the accompanying Claims to Invention.

What is claimed is:

1. A method of converting a field-programmable gate array (FPGA) implementation of a digital logic design, into a mask-programmable logic cell (MPLC) implementation of said digital logic design, the method comprising the steps of:
  (a) selecting a FPGA device and a FPGA library for use in achieving said FPGA implementation, said FPGA device including a package containing a substrate carrying a plurality of a programmable input and output interface blocks (IOBs) each having input and output ports operably associated with a plurality of pins on said package and programmable logic circuitry contained therein, a plurality of programmable configurable logic blocks(CLBs) each having input and output ports and programmable logic circuitry contained therein, a plurality of programmable interconnect switches for selectively interconnecting the input and output ports of said CLBs and the input and output ports of said IOBs so to form a first signal network for routing signals within said FPGA device with first set of signal delays, (b) generating a FPGA netlist for said FPGA implementation, said hierarchical FPGA netlist containing a CLB description for each said CLB utilized in said FPGA implementation, an IOB description for each said IOB utilized in said FPGA implementation, and port connectivity specifications specifying the interconnections to be established between the input and output ports of said utilized CLBs and said utilized IOBs, effectuated by said plurality of programmable interconnect switches, in order to form said first signal network within said FPGA device;

(c) selecting a MPLC device and a MPLC library for use in achieving said MPLC implementation, said MPLC device including a package containing a substrate having at least one interconnect level and an array of a logic cells which can be selectively configured at said at least one interconnect level to form a plurality of Soft-CLBs and a plurality of Soft-IOBs on said MPLC substrate, wherein each said Soft-CLB and each said Soft-IOB has input and output ports interconnectable at said at least one interconnect level by applying a metalization layer of computable geometry to said MPGA substrate, in order to form a second signal network for routing signals within said MPLC device with a second set of signal delays said second signal network physically corresponding to said first signal network;

(d) generating a MPLC netlist for said MPLC implementation, said MPLC netlist containing hierarchical information regarding said MPLC implementation including a Soft-CLB description for each said Soft-CLB to be formed on said MPLC substrate, a Soft-CLB connectivity description specifying the connectivity of the input and output ports of said Soft-CLBs specified in said MPLC netlist, a Soft-IOB description for each said Soft-IOB to be formed on said MPLC substrate, and a Soft-IOB connectivity description specifying the connectivity of the input and output ports of said Soft-IOBs specified in said MPLC netlist;

(e) using said modified MPLC netlist and said MPLC library to generate a geometrical database containing geometrical information specifying the physical placement of each said Soft-CLB and each said Soft-IOB on said MPLC substrate, and geometrical information specifying the signal paths on said MPLC substrate interconnecting the input and output ports of said CLBs and IOBs in accordance with said Soft-CLB connectivity description and said Soft-IOB connectivity description, such that the relative signal delays presented during said FPGA implementation are substantially maintained in said MPLC implementation, thereby assuring functional equivalence between said FPGA and MPLC implementations.

2. The method of claim 1, wherein step (a), said selected FPGA device further comprises a clock signal producing means for producing clock signals for use by said CLBs and IOBs, a clock signal distribution structure having a first plurality of conductive elements for routing within said clock signals to said CLBs and IOBs, and wherein said method further comprises after step (d), producing a modified MPLC netlist by adding to said MPLC netlist, a description of said clock signal producing means on said MPLC substrate and a description of said clock signal distribution structure on said MPLC substrate;

and wherein said geometrical database further comprises geometrical information specifying the physical placement of said clock signal producing means and said reset signal producing means on said MPLC substrate, and also geometrical information specifying the physical routing of said clock signal distribution structure on said MPLC substrate.

3. The method of claim 1, which further comprises during step (d), adding to said modified MPLC netlist, a Soft-CLB load for each said CLB in said FPGA device not utilized in realizing said FPGA implementation.

4. The method of claim 3, which further comprises (f) using said geometrical database to produce a set of photolithic processing masks for use in forming said metalization layer on said MPGA substrate.

5. The method of claim 4, which further comprises (g) using said produced set of photolithic processing masks to form said metalization layer on said MPGA substrate.

6. The method of claim 1, wherein said MPLC implementation is a mask-programmable gate array(MPGA) implementation, wherein and said MPLC device is a MPGA device, and said MPLC library is a MPGA library.

7. The method of claim 1, wherein said MPLC implementation is a, mask-programmable standard cell(MPSC) implementation, wherein and said MPLC device is a MPSC device, and said MPLC library is a MPSC library.

8. The method of claim 2, where during the production of said geometrical database, said each said Soft-CLB is placed at a physical location on said MPLC substrate which is relatively the same as the physical location of the corresponding CLB on said FPGA substrate, wherein each said Soft-IOB is placed at a physical location on said MPLC substrate which is relatively the same as the physical location of the corresponding IOB on said FPGA substrate, wherein each said clock signal producing means on said MPLC substrate is placed at a physical location on said MPLC substrate which is relatively the same as the physical location of the corresponding clock signal producing means on said FPGA substrate, and wherein the physical routing of said clock signal distribution structure on said MPLC substrate is routed along a signal route on said MPLC substrate which is relatively the same as the signal route of the corresponding clock distribution structure on said FPGA substrate.

9. A method of converting a field-programmable gate array (FPGA) implementation of a digital logic design, into a mask-programmable logic cell (MPLC) implementation of said digital logic design, the method comprising the steps of:

(a) selecting a FPGA device and a FPGA library for use in achieving said FPGA implementation, said FPGA device including a package containing a substrate carrying a plurality of a programmable input and output interface blocks (IOBs) each having input and output ports operably associated with a plurality of pins on said package and programmable logic circuitry contained therein, a plurality of programmable configurable logic blocks (CLBs) each having input and output ports and programmable logic circuitry contained therein, a plurality of programmable interconnect switches for selectively interconnecting the input and output ports of said CLBs and the input and output ports of said IOBs so to form a first signal network for routing signals within said FPGA device with a first set of signal delays, a clock signal producing means for producing clock signals for use by said CLBs and IOBs, and a clock signal distribution structure having a first plurality of conductive elements for routing within said clock signals to said CLBs and IOBs, (b) generating a FPGA netlist for said FPGA implementation, said FPGA netlist containing hierarchial information, including a CLB description for each said CLB utilized in said FPGA implementation, an IOB description for each said IOB utilized in said FPGA implementation, and port connectivity specifications specifying the interconnections to be established between the input and output ports of said utilized CLBs and said utilized IOBs, effectuated by said plurality of programmable interconnect switches, in order to form said second signal network within said FPGA device;

(c) selecting a MPLC device and a MPLC library for use in achieving said MPLC implementation, said MPLC device including a package containing a substrate having at least an interconnect level and carrying an array of a logic cells which can be selectively configured at said at least interconnect level to form a plurality of Soft-CLBs and a plurality of Soft-IOBs on said MPLC substrate, wherein each said Soft-CLB and each said Soft-IOB has input and output ports that can be interconnected at said interconnect level by applying a metalization layer of computed geometry to said MPGA substrate, in order to form a second signal network for routing signals within said MPLC device with a second set of signal delays, said second signal network physically corresponding to said first signal network;

(d) generating a MPLC netlist for said MPLC implementation, said MPLC netlist including a Soft-CLB description for each said Soft-CLB to be formed on said MPLC substrate, a Soft-CLB connectivity description specifying the connectivity of the input and output ports of said Soft-CLBs specified in said MPLC netlist, a Soft-IOB description for each said Soft-IOB to be formed on said MPLC substrate, and a Soft-IOB connectivity description specifying the connectivity of the input and output ports of said Soft-IOBs specified in said MPLC netlist;

(e) producing a modified MPLC netlist by adding to said MPLC netlist, (1) a Soft-CLB load for each said CLB in said FPGA device not utilized in realizing said FPGA implementation, (2) a description of said clock signal producing means located on said MPLC substrate, and (3) a description of said clock signal distribution structure located on said MPLC substrate, (f) using said modified MPLC netlist and said MPLC library to generate a geometrical database containing geometrical information regarding the physical placement of each said Soft-CLB, the physical placement of each said Soft-IOB, and the physical placement of said clock signal producing means on said MPLC substrate, and geometrical information specifying the physical routing of said clock signal distribution structure, and the signal paths on said MPLC substrate interconnecting the input and output ports of said CLBs and IOBs in accordance with said Soft-CLB connectivity description and said Soft-IOB connectivity description, wherein the physical placement of said Soft-CLBs, said Soft IOBS, and said clock signal producing means on said MPLC substrate is the same as the relative physical placement of corresponding Soft-CLBs, corresponding Soft IOBS, and corresponding clock signal producing means on said FPGA substrate, such that the relative signal and clock delays presented during said FPGA implementation are substantially maintained in said MPLC implementation, thereby assuring functional equivalence between said FPGA and MPLC implementations.

10. The method of claim 9, which further comprises (g) using said geometrical database to produce a set of photolithic processing masks for use in forming said metalization layer on said MPGA substrate.

11. The method of claim 10, which further comprises (h) using said produced set of photolithic processing masks to form said metalization layer on said MPGA substrate.

12. The method of claim 9, wherein said MPLC implementation is a mask-programmable gate array (MPGA) implementation, wherein and said MPLC device is a MPGA device, and said MPLC library is a MPGA library.

13. The method of claim 9, wherein said MPLC implementation is a mask-programmable standard cell (MPSC) implementation, wherein and said MPLC device is a MPSC device, and said MPLC library is a MPSC library.

14. A computer-based system for converting a field-programmable gate array (FPGA) implementation of a digital logic design, into a mask-programmable logic cell (MPLC) implementation of said digital logic design, said computer-based system comprising:

information storage means for storing information, including information representative of a FPGA device and a FPGA library for use in achieving said FPGA implementation, said FPGA device including a package containing a substrate carrying a plurality of a programmable input and output interface blocks (IOBs) each having input and output ports operably associated with a plurality of pins on said package and programmable logic circuitry contained therein, a plurality of programmable configurable logic blocks (CLBs) each having input and output ports and programmable logic circuitry contained therein, and a plurality of programmable interconnect switches for selectively interconnecting the input and output ports of said CLBs and the input and output ports of said IOBs so to form on said FPGA substrate a first signal network for routing signals within said FPGA device with determinable amounts of signal delay, said information storage means further storing information representative of a selected MPLC device and a MPLC library used in realizing said MPLC implementation, said MPLC device including a package containing a MPLC substrate having at least one interconnect level and carrying an array of a logic cells selectively configurable at said at least one interconnect level to form a plurality of Soft-CLBs and a plurality of Soft-IOBs on said MPLC substrate, wherein each said Soft-CLB and each said Soft-IOB has input and output ports interconnectable at said at least one interconnect level by applying a metalization layer of computable geometry to said MPGA substrate, in order to form a second signal network for routing signals within said MPLC device with a determinable amount of signal delay, said first signal network physically corresponding to said second signal network;

programmed information processing means, operably associated with said information storage means, for generating a first data structure representative of a FPGA netlist for said FPGA implementation using said FPGA device, said FPGA netlist containing hierarchical information including a CLB description for each said CLB utilized in said FPGA implementation, an IOB description for each said IOB utilized in said FPGA implementation, and port connectivity specifications specifying the interconnections to be established between the input and output ports of said utilized CLBs and said utilized IOBs, effectuated by said plurality of programmable interconnect switches, in order to form said first signal network within said FPGA device, said programmed information processing means further generating a second information structure representative of a MPLC netlist for said MPLC implementation using said MPLC device, said MPLC netlist containing hierarchical information including a Soft-CLB description for each said Soft-CLB to be formed on said MPLC substrate, a Soft-CLB connectivity description specifying the connectivity of the input and output ports of said Soft-CLBs specified in said MPLC netlist, a Soft-IOB description for each said Soft-IOB to be formed on said MPLC substrate, and a Soft-IOB connectivity description specifying the connectivity of the input and output ports of said Soft-IOBs specified in said MPLC netlist, and said programmed information processing means further generating a geometrical database using said modified MPLC netlist and said MPLC library, said geometrical database containing geometrical information specifying the physical placement of each said Soft-CLB, and each said Soft-IOB, said clock signal producing means, and geometrical information specifying the physical routing of the signal paths on said MPLC substrate interconnecting the input and output ports of said CLBs and IOBs in accordance with said Soft-CLB connectivity description and said Soft-IOB connectivity description, such that the relative signal delays presented in said first signal network of said FPGA implementation are substantially maintained in said second signal network of said MPLC implementation, thereby assuring functional equivalence between said FPGA and MPLC implementations.

15. The computer-based system of claim 14, wherein said FPGA device further comprises a clock signal producing means for producing clock signals for use by said CLBs and IOBs; and a clock signal distribution structure having a first plurality of conductive elements for routing within said clock signals to said CLBs and IOBs;

a reset signal producing means for producing a reset signal for use by said CLBs and said IOBs; and wherein said computer-based system further comprises means for adding information to said second information structure so as to produce a modified MPLC netlist which further includes a description of said clock signal producing means on said MPLC substrate, and a description of said clock signal distribution structure on said MPLC substrate;

said programmed information processing means using said modified MPLC netlist and said MPLC library to generate additional geometrical information and to add said additional geometrical information to said geometrical database, said additional geometrical information further specifying the physical placement of said clock signal producing means on said MPLC substrate and also specifying the physical routing of said clock signal distribution structure on said MPLC substrate.

16. The computer-based system of claim 15, wherein said programmed information processing means further including means for adding to said modified MPLC netlist, a Soft-CLB load for each said CLB in said FPGA device not utilized in realizing said FPGA implementation.

17. The computer-based system of claim 15, which further comprises means for producing a set of photolithic processing masks, using said geometrical database.

18. The computer-based system of claim 17, which further comprises means for forming said metallization layer on said MPGA substrate, using said produced set of photolithic processing masks.

19. The computer-based system of claim 15, wherein said MPLC implementation is a mask-programmable gate array (MPGA) implementation, wherein and said MPLC device is a MPGA device, and said MPLC library is an MPGA library.

20. The computer-based system of claim 15, wherein said MPLC implementation is a mask-programmable standard cell (MPSC) implementation, wherein and said MPLC device is a MPSC device, and said MPLC library is an MPSC library.

* * * * *